United States Patent
Okamoto et al.

(10) Patent No.: US 9,613,974 B2
(45) Date of Patent: Apr. 4, 2017

(54) SEMICONDUCTOR DEVICE AND METHOD FOR MANUFACTURING THE SAME

(71) Applicant: Kabushiki Kaisha Toshiba, Minato-ku (JP)

(72) Inventors: Hiroki Okamoto, Nishinomiya (JP); Hiroshi Itokawa, Oita (JP); Masayuki Kitamura, Yokkaichi (JP); Atsushi Yagishita, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/821,910

(22) Filed: Aug. 10, 2015

(65) Prior Publication Data

US 2016/0268285 A1    Sep. 15, 2016

Related U.S. Application Data

(60) Provisional application No. 62/132,943, filed on Mar. 13, 2015.

(51) Int. Cl.
| | | |
|---|---|---|
| *H01L 27/11573* | (2017.01) | |
| *H01L 27/1157* | (2017.01) | |
| *H01L 27/11582* | (2017.01) | |
| *H01L 23/535* | (2006.01) | |
| *H01L 23/532* | (2006.01) | |
| *H01L 21/768* | (2006.01) | |

(52) U.S. Cl.
CPC .. *H01L 27/11573* (2013.01); *H01L 21/76805* (2013.01); *H01L 21/76889* (2013.01); *H01L 21/76895* (2013.01); *H01L 23/535* (2013.01); *H01L 23/53266* (2013.01); *H01L 27/1157* (2013.01); *H01L 27/11582* (2013.01)

(58) Field of Classification Search
CPC ............... H01L 29/665; H01L 29/6659; H01L 29/6656; H01L 21/28158; H01L 21/28052
USPC .......................................................... 257/384
See application file for complete search history.

(56) References Cited

U.S. PATENT DOCUMENTS

| | | | |
|---|---|---|---|
| 8,207,040 B2 | 6/2012 | Chung et al. | |
| 8,304,819 B2 * | 11/2012 | Jung | ................ H01L 21/28512 257/181 |
| 2014/0077288 A1 | 3/2014 | Yamamoto et al. | |

FOREIGN PATENT DOCUMENTS

| | | |
|---|---|---|
| JP | 2009-164200 | 7/2009 |
| JP | 2011-9308 | 1/2011 |

OTHER PUBLICATIONS

T. Morimoto et al. "A NiSi Salicide Technology for Advanced Logic Devices", Electron Devices Meeting, 1991, IEDM '91, Technical Digest., International, IEEE, 1991, 4 pages.

* cited by examiner

*Primary Examiner* — Quoc Hoang
(74) *Attorney, Agent, or Firm* — Oblon, McClelland, Maier & Nesutadt, L.L.P.

(57) ABSTRACT

According to one embodiment, the contact electrode extends in the inter-layer insulating layer toward the second semiconductor region. The metal silicide film is in contact with the second semiconductor region and the contact electrode. The metal silicide film includes a first part and a second part. The first part is provided between a bottom of the contact electrode and the second semiconductor region. The second part is provided on a surface of the second semiconductor region between the first part and the gate electrode. A bottom of the second part is located at a position shallower than a bottom the first part.

6 Claims, 23 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from U.S. Provisional Patent Application 62/132,943, filed on Mar. 13, 2015; the entire contents of which are incorporated herein by reference.

FIELD

Embodiments described herein relate generally to a semiconductor device and a method for manufacturing a semiconductor device.

BACKGROUND

In order to achieve reduction of the bit cost with the increase in capacity of a memory device, there are required miniaturization and improvement of the performance of each of the elements including a control circuit of the periphery of a memory cell array.

In the transistors constituting the control circuit, when the gate length is shortened to decrease the channel resistance, a parasitic resistance such as a resistance between the source-drain region and a contact electrode significantly affects the device characteristics, and therefore, the reduction of the parasitic resistance is required.

DETAILED DESCRIPTION

Figure 1:
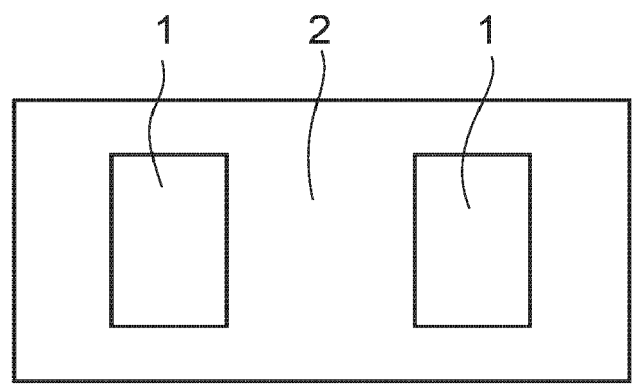
FIG. 1 is a schematic plan view showing a planar layout of a semiconductor device of an embodiment.

According to one embodiment, a semiconductor device includes a semiconductor layer, a gate insulating film, a gate electrode, an inter-layer insulating layer, a contact electrode, and a metal silicide film. The semiconductor layer contains silicon. The semiconductor layer includes a first semiconductor region having a first conductivity type and a second semiconductor region having a second conductivity type. The gate insulating film is provided on the first semiconductor region. The gate electrode is provided on the gate insulating film. The inter-layer insulating layer is provided on the semiconductor layer and covers the gate electrode. The contact electrode extends in the inter-layer insulating layer toward the second semiconductor region. The metal silicide film is in contact with the second semiconductor region and the contact electrode. The metal silicide film includes a first part and a second part. The first part is provided between a bottom of the contact electrode and the second semiconductor region. The second part is provided on a surface of the second semiconductor region between the first part and the gate electrode. A bottom of the second part is located at a position shallower than a bottom the first part.

Some embodiments of the invention will hereinafter be described with reference to the accompanying drawings. It should be noted that in the drawings, the same elements are denoted with the same reference symbols.

FIG. 1 is a schematic plan view showing a planar layout of a semiconductor device according to the embodiment.

The semiconductor device according to the embodiment has, for example, a memory cell array 1 as an element section, and a control section 2 provided in the periphery of the memory cell array 1.

In an example shown in FIG. 1, the memory cell array 1 is provided so as to be separated into two areas (blocks). Alternately, the memory cell array 1 can also be separated into three or more areas, or can also be provided in one area.

Firstly, the memory cell array 1 will be described.

Figure 2:
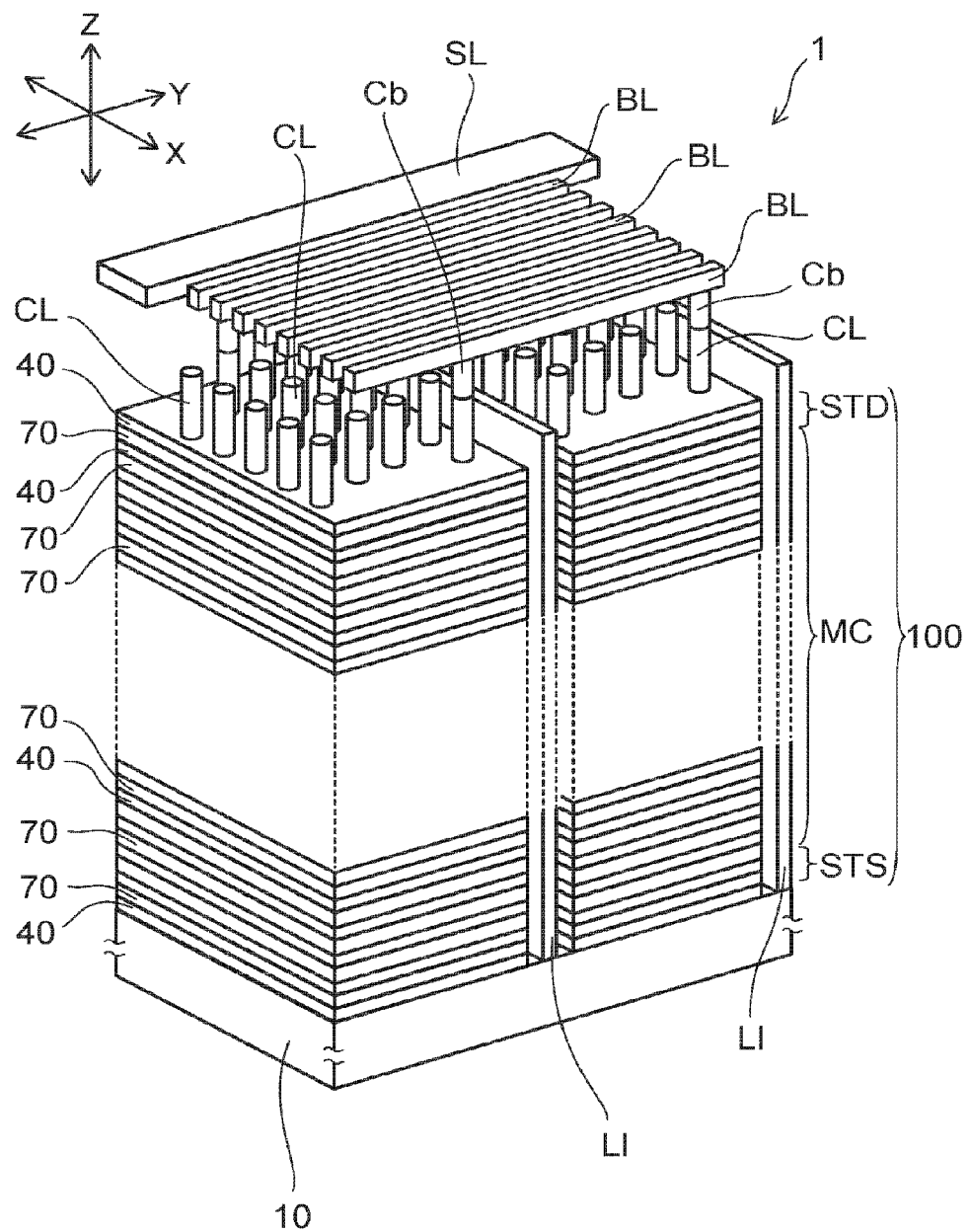
FIG. 2 is a schematic perspective view of a memory cell array of the embodiment.

FIG. 2 is a schematic perspective view of the memory cell array 1.

In FIG. 2, two directions parallel to a major surface of a substrate 10 and perpendicular to each other are defined as an X-direction (a first direction) and a Y-direction (a second direction), and a direction perpendicular to both of the X-direction and the Y-direction is defined as a Z-direction (a third direction, a stacking direction).

The memory cell array 1 has the substrate 10, a stacked body 100 provided on the substrate 10, a plurality of columnar sections CL, conductive members LI, and upper interconnection provided above the stacked body 100. FIG. 2 shows bit lines BL and a source layer SL as the upper interconnection.

The columnar section CL is formed to have a columnar or elliptic cylinder shape extending through the stacked body 100 in the stacking direction (the Z-direction). The conductive member LI is located between the upper interconnection and the substrate 10 so as to extend in the stacking direction (the Z-direction) of the stacked body 100, and extend in the X-direction to separate the stacked body 100 into blocks in the Y-direction.

The plurality of columnar sections CL are disposed in, for example, a hound's-tooth check pattern. Alternatively, the plurality of columnar sections CL can also be disposed in a square lattice along the X-direction and the Y-direction.

A plurality of bit lines (e.g., metal films) BL is provided above the stacked body 100. The bit lines BL are separated in the X-direction from each other, and each extend in the Y-direction.

An upper end section of the columnar section CL is connected to the bit line BL via a contact section Cb. A columnar section group, which includes a plurality of columnar sections CL respectively selected from respective areas separated in the Y-direction by the conductive members LI, are connected to one common bit line BL.

Figure 3:
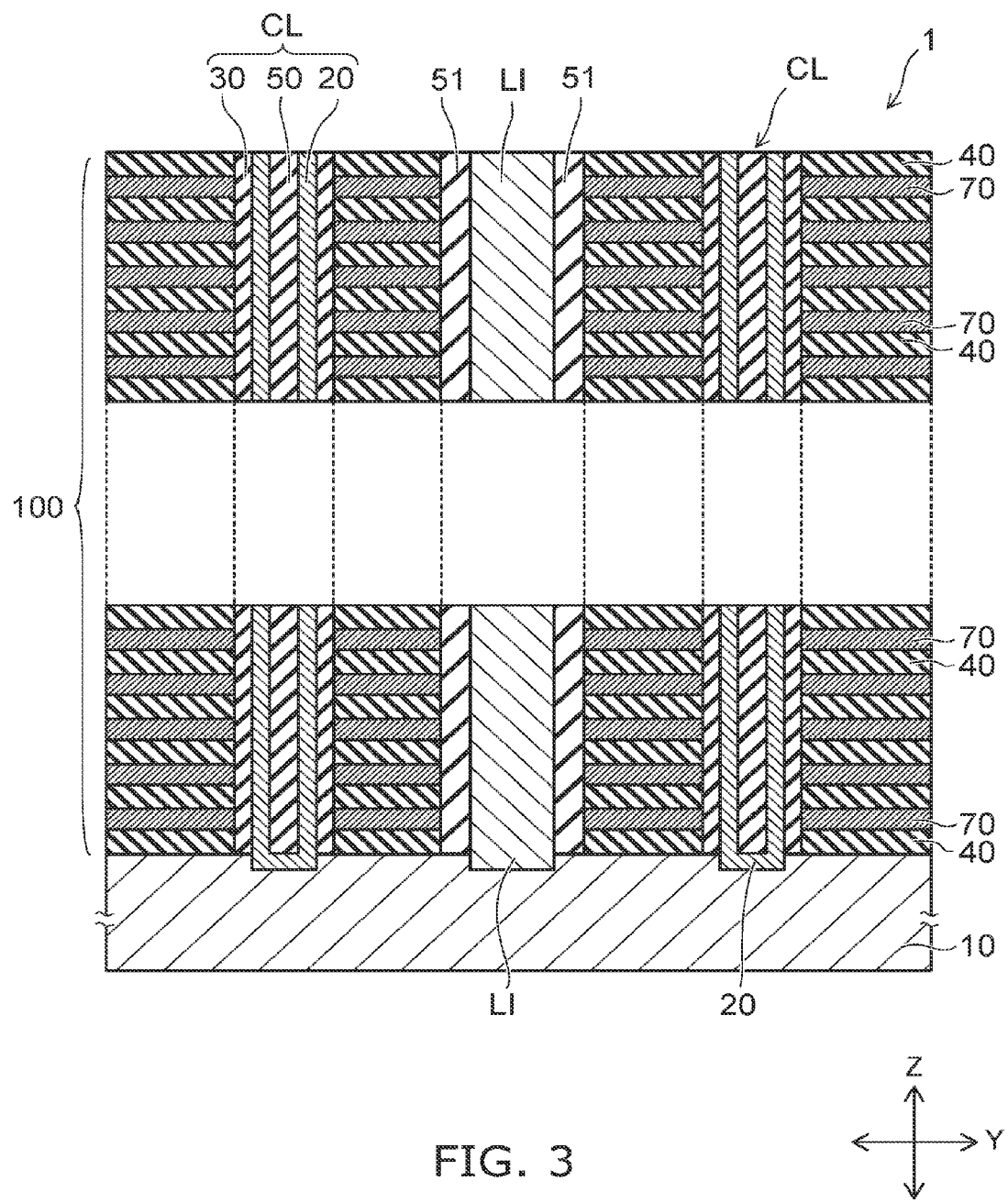
FIG. 3 is a schematic cross-sectional view of the memory cell array of the embodiment.

FIG. 3 is a schematic cross-sectional view of a part where the substrate 10 and the stacked body 100 are disposed. FIG. 3 shows a cross-sectional surface parallel to the Y-Z plane in FIG. 2.

The stacked body 100 has a plurality of electrode layers 70 and a plurality of insulating layers 40. The plurality of electrode layers 70 and the plurality of insulating layers 40 are stacked in a direction (the Z-direction) perpendicular to the major surface of the substrate 10.

The electrode layers 70 are metal layers, and contain, for example, tungsten or molybdenum as a principal component. Alternatively, the electrode layers 70 are silicon layers doped with, for example, boron as an impurity. The insulating layers 40 include, for example, silicon oxide as a principal component.

As shown in FIG. 3, the columnar section CL has a memory film 30, a semiconductor film 20, and a core insulating film 50. The memory film 30 and the semiconductor film 20 extend in the stacked body 100 in the stacking direction (the Z-direction) so as to form a cylindrical shape. The memory film 30 is provided between the stacked body 100 and the semiconductor film 20 to surround the semiconductor film 20 from the outer peripheral side. The core insulating film 50 is provided inside the semiconductor film 20 having a cylindrical shape. An upper end part of the semiconductor film 20 is electrically connected to the bit line BL via the contact section Cb shown in FIG. 2.

Figure 4:
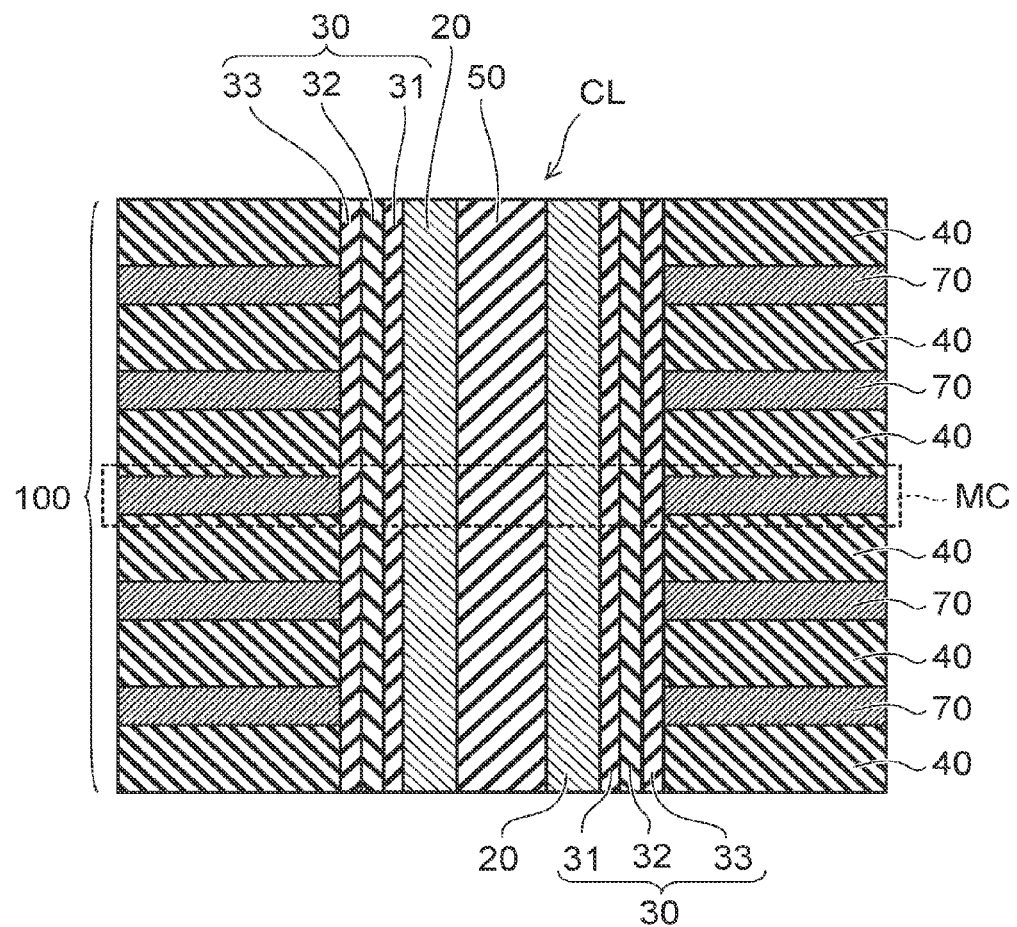
FIG. 4 is a partial enlarged cross-sectional view of FIG. 3.

FIG. 4 is a partial enlarged cross-sectional view of FIG. 3.

The memory film 30 has a block insulating film 33, a charge storage film 32, and a tunnel insulating film 31. The block insulating film 33, the charge storage film 32, the tunnel insulating film 31, and the semiconductor film 20 continuously extend in the stacking direction of the stacked body 100. The block insulating film 33, the charge storage film 32, and the tunnel insulating film 31 are provided sequentially in this order from the stacked body 100 side between the stacked body 100 and the semiconductor film 20.

The block insulating film 33 has contact with the electrode layer 70, the tunnel insulating film 31 has contact with the semiconductor film 20, and the charge storage film 32 is provided between the block insulating film 33 and the tunnel insulating film 31.

The semiconductor film 20, the memory film 30, and the electrode layer 70 constitute a memory cell MC. The memory cell MC has a vertical transistor structure in which the electrode layer 70 surrounds the periphery of the semiconductor film 20 via the memory film 30.

The semiconductor film 20 functions as the channel of the memory cell MC having the vertical transistor structure, and the electrode layer 70 functions as a control gate (a control electrode). The charge storage film 32 functions as a data memory layer for storing the charge injected from the semiconductor film 20.

The semiconductor device according to the embodiment is a nonvolatile semiconductor memory device capable of electrically and freely performing data erasure and data writing, and holding the storage contents even if the power is cut.

The memory cell MC is, for example, a charge-trapping memory cell. The charge storage film 32 has a number of trap sites for trapping the charge, and includes, for example, a silicon nitride film.

The tunnel insulating film 31 is a potential barrier when the charge is injected from the semiconductor film 20 to the charge storage film 32, or when the charge stored in the charge storage film 32 is diffused in the semiconductor film 20. The tunnel insulating film 31 includes, for example, a silicon oxide film. Alternatively, the tunnel insulating film 31 includes a stacked film (ONO film) having a structure of interposing a silicon nitride film with a pair of silicon oxide films. The tunnel insulating film 31 including the ONO film makes it possible to perform an erasure operation in a lower electric field compared to a single layer of a silicon oxide film.

The block insulating film 33 prevents the charge stored in the charge storage film 32 from being diffused to the electrode layer 70. The block insulating film 33 includes a stacked film of, for example, a silicon oxide film, and a film (e.g., a silicon nitride film, an aluminum oxide film, a hafnium oxide film, or an yttrium oxide film) higher in dielectric constant than the silicon oxide film.

As shown in FIG. 2, drain side select transistors STD are provided at the upper end portions of the columnar sections CL, and source side select transistors STS are provided at the lower end portions of the columnar sections CL. At least lowermost one of the electrode layers 70 functions as a control gate (a control electrode) of the source side select transistor STS. At least uppermost one of the electrode layers 70 functions as a control gate (a control electrode) of the drain side select transistor STD. The drain side select transistor STD and the source side select transistor STS are vertical transistors through which a current flows in the stacking direction (the Z-direction) of the stacked body 100 similarly to the memory cell MC.

The plurality of memory cells MC are provided between the drain side select transistor STD and the source side select transistor STS. The plurality of memory cells MC, the drain side select transistor STD, and the source side select transistor STS are connected in series to each other via the semiconductor film 20 to constitute one memory string. The memory strings are disposed in directions of a plane parallel to the X-Y plane in, for example, a hound's-tooth check pattern, and thus, the plurality of memory cells MC are three-dimensionally arranged in the X-direction, Y-direction, and the Z-direction.

As shown in FIG. 3, insulating films 51 are provided on both sidewalls of the conductive member LI separating the stacked body 100 in the Y-direction, the sidewalls being located in the Y-direction. The insulating film 51 is provided between the stacked body 100 and the conductive member LI. In FIG. 2, the insulating film 51 is not shown.

The conductive member LI is a metal member including, for example, tungsten as a principal component. The upper end portion of the conductive member LI is connected to the source layer SL shown in FIG. 2 provided above the stacked body 100. The lower end of the conductive member LI has contact with the substrate 10 as shown in FIG. 3. Further, the lower end of the semiconductor film 20 has contact with the substrate 10. The substrate 10 is, for example, a silicon substrate doped with an impurity to be provided with electrical conductivity. Therefore, the lower end of the semiconductor film 20 is electrically connected to the source layer SL via the substrate 10 and the conductive member LI.

Then, the control section 2 will be described.

Figure 5:
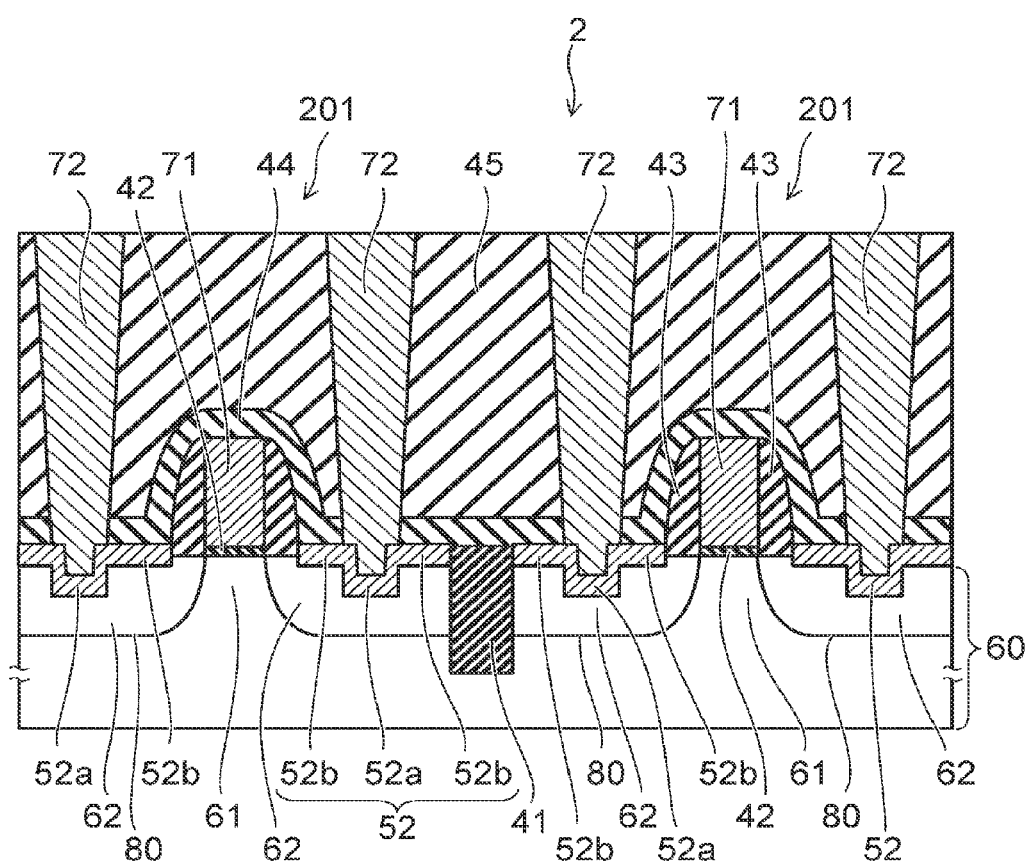
FIG. 5 is a schematic cross-sectional view of a transistor of a control section of a first embodiment.

FIG. 5 is a schematic cross-sectional view of the control section 2.

Figure 6:
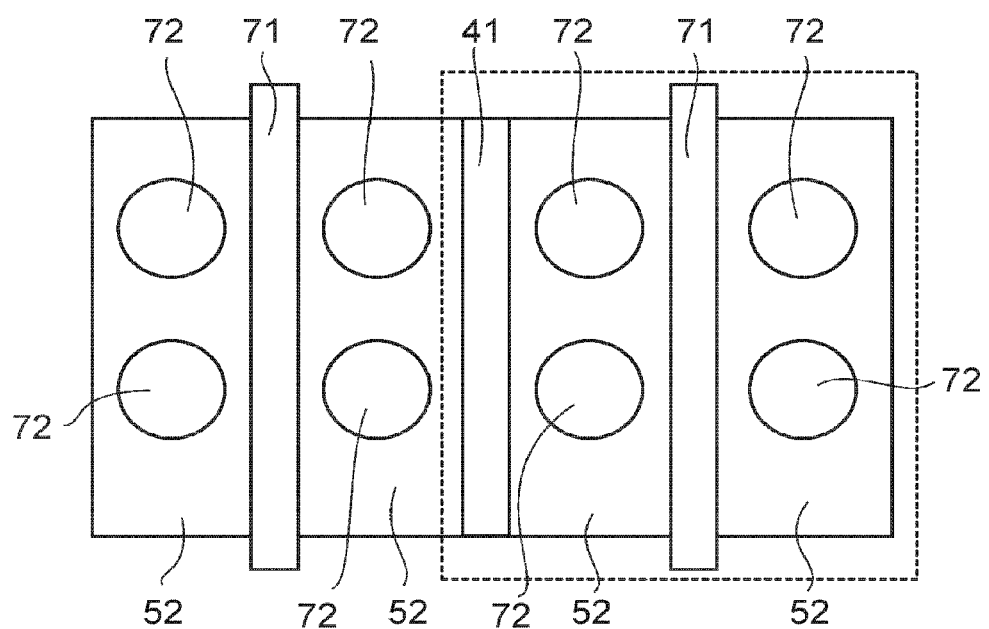
FIG. 6 is a schematic plan view showing a planar layout of the transistor of the first embodiment.

FIG. 6 is a schematic plan view showing a planar layout of some elements in the control section 2.

The control section 3 includes a plurality of transistors 201. The transistors 201 are provided on a semiconductor layer 60.

The memory cell array 1 described above and the transistors 201 of the control section 2 are provided on the same substrate 10. The semiconductor layer 60 is provided on the surface side of the substrate 10, and includes, for example, silicon as a principal component.

The transistor 201 has a first semiconductor region 61, second semiconductor regions 62, a gate insulating film 42, a gate electrode 71, contact electrodes 72, and metal silicide films 52.

The first semiconductor region 61 and the second semiconductor regions 62 are provided on the surface side of the semiconductor layer 60, and include silicon as a principal component. The first semiconductor region 61 is provided between a pair of second semiconductor regions 62. One of the pair of second semiconductor regions 62 functions as a drain region, and the other of the pair of second semiconductor regions 62 functions as a source region. Due to the potential control of the gate electrode 71, a channel (or an inversion layer) is induced in the first semiconductor region 61.

The first semiconductor region 61 is of the p-type or the n-type, the second semiconductor regions 62 are of the n-type or the p-type as the opposite conductivity type to the first semiconductor region 61, and the first semiconductor region 61 and each of the second semiconductor regions 62 are provided with a p-n junction.

The second semiconductor region 62 is provided on a region (layer) having the opposite conductivity type to the second semiconductor region 62, and the bottom of the second semiconductor region 62 also has the p-n junction with the region (layer) below the bottom.

The control section 2 includes, for example, a complementary metal-oxide-semiconductor (CMOS) circuit including an n-type metal-oxide semiconductor field effect transistor (MOSFET) and a p-type MOSFET.

The transistors 201 adjacent to each other are separated by an isolation film 41 provided on the surface side of the semiconductor layer 60. The isolation film 41 has a structure in which, for example, an insulating film is buried in a trench.

The gate electrode 71 is provided on the first semiconductor region 61 via the gate insulating film 42. Sidewall insulating films 43 are respectively provided on the both sidewalls of the gate electrode 71, the sidewalls being located in the gate length direction.

The metal silicide films 52 are respectively provided on the surface side of the second semiconductor regions 62. The metal silicide films 52 are each, for example, a nickel silicide film or a cobalt silicide film.

An inter-layer insulating layer 45 is provided on the semiconductor layer 60 via an insulating film 44. The inter-layer insulating layer 45 includes, for example, silicon oxide as a principal component. The insulating film 44 is a layer different in material from the inter-layer insulating layer 45, and includes, for example, silicon nitride as a principal component.

The insulating film 44 conformally covers upper surfaces of the metal silicide films 52, side surfaces of the sidewall insulating films 43, and upper surfaces of the gate electrodes 71. The inter-layer insulating layer 45 thicker than the insulating film 44 is provided on the insulating film 44. The inter-layer insulating layer 45 covers the metal silicide films 52, the sidewall insulating films 43, and the gate electrodes 71 via the insulating film 44.

The contact electrodes 72 are provided in the inter-layer insulating layer 45. The contact electrode 72 extends in a thickness direction of the inter-layer insulating layer 45 toward the second semiconductor region 62 and the metal silicide film 52. The lower end portion of the contact electrode 72 has contact with the metal silicide film 52. The contact electrode 72 does not penetrate the metal silicide film 52, and does not have direct contact with the second semiconductor region 62.

The metal silicide film 52 includes a first part 52a and a second part 52b. The first part 52a is provided between the bottom of the lower end portion of the contact electrode 72 and the second semiconductor region 62. The first part 52a is located in an area overlapping the contact electrode 72 viewed from above. The second part 52b is provided on the surface of the second semiconductor region 62 in an area between the first part 52a and the gate electrode 71.

The second part 52b is provided at a position shallower than the first part 52a, and the bottom of the second part 52b is located at a position shallower than the bottom of the first part 52a. The first part 52a and the second part 52b are integrally provided continuously with a step. The bottom of the first part 52a and the bottom of the second part 52b are located in the second semiconductor region 62 and have contact with the second semiconductor region 62. The bottom of the second part 52b is located further from a p-n junction 80 on the bottom of the second semiconductor region 62 than the bottom of the first part 52a.

The first part 52a is provided immediately below the contact electrode 72 and has contact with the bottom of the lower end portion of the contact electrode 72. The second part 52b surrounds the periphery of the side surface of the lower end portion of the contact electrode 72, and has contact with the side surface of the lower end portion of the contact electrode 72. The first part 52a is thicker than the second part 52b.

As shown in FIG. 6, the gate electrode 71 is provided in a line pattern. The gate electrode 71 extends in a gate width direction perpendicular to the gate length direction (a direction connecting the pair of second semiconductor regions 62 (the source and the drain)).

The metal silicide film 52 spreads in an area immediately below the lower end portion of the contact electrode 72 and a peripheral area of the lower end portion.

The second semiconductor region 62 is electrically connected to the contact electrode 72 via the metal silicide film 52.

The contact electrodes 72 and the gate electrode 71 are electrically connected to an upper interconnection layer (not shown) provided on the inter-layer insulating layer 45. The upper interconnection layer is connected to the bit lines BL, the source layer SL, and the electrode layer 70 of the memory cell array 1 shown in FIG. 2, and an external circuit. Therefore, the memory cell array 1 is electrically connected to the external circuit via the control section 2.

Then, a forming method of the control section 2 will be explained with reference to FIGS. 7A, 7B, and FIG. 8 through FIG. 11.

Prior to the memory cell array 1, the transistors 201 of the control section 2 are formed on the substrate 10.

Figure 7A:
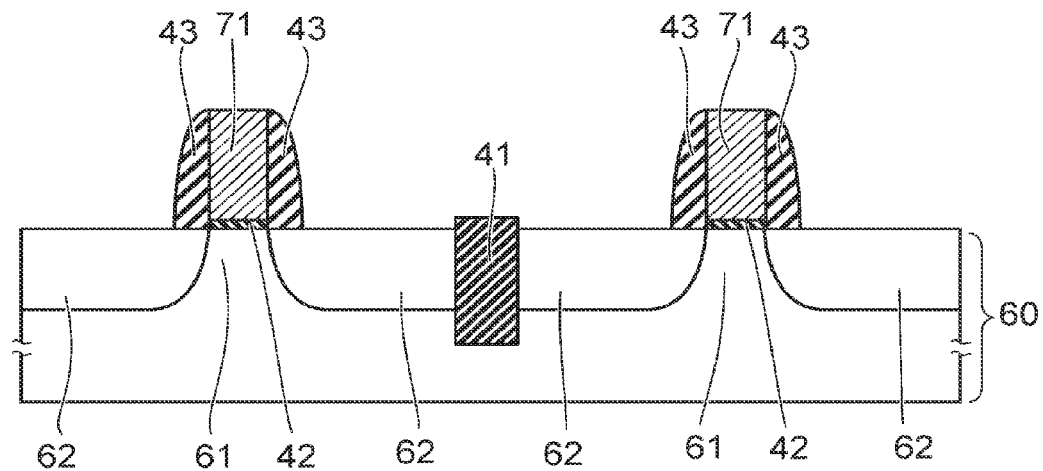
FIGS. 7A to 11 are schematic cross-sectional views showing a method for manufacturing the transistor of the first embodiment.

After forming the device isolation films 41 on the semiconductor layer 60 formed on the surface side of the substrate 10, the gate insulating films 42, the gate electrodes 71, and the sidewall insulating films 43 are formed as shown in FIG. 7A. The semiconductor layer 60 has the first semiconductor regions 61 on the surface side thereof.

Subsequently, an impurity is injected on the surface of the semiconductor layer 60 in the areas located lateral to the gate electrode 71 in the gate length direction by an ion injection method. Due to a subsequent thermal annealing, the injected impurity is diffused and activated, and thus, the second semiconductor regions 62 are formed on the surface of the semiconductor layer 60. It should be noted that the thermal annealing for diffusing and activating the impurity is not required to be performed immediately after the ion injection. In the case in which the impurity has not yet been diffused at the time point of FIG. 7A, the second semiconductor regions 62 shown in the drawing show the regions in which the second semiconductor regions 62 are to be formed.

Figure 7B:
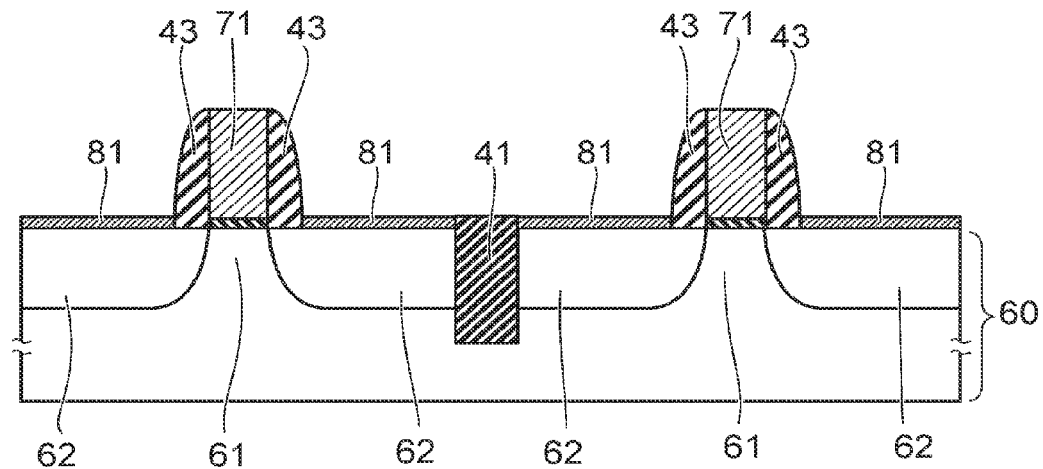

Then, silicon-germanium films 81 are formed on the surface of each of the second semiconductor regions 62 as shown in FIG. 7B. The silicon-germanium film 81 is a sacrifice film to be removed in a later process. The silicon-germanium film 81 is a film different in material from the semiconductor layer 60 as a silicon layer, and has etching selectivity with respect to the semiconductor layer 60 (the second semiconductor region 62).

For example, the silicon-germanium film 81 having a thickness of several nanometers is epitaxially grown on the surface of the second semiconductor region 62. Therefore, the silicon-germanium film 81 has the same crystal orientation as the semiconductor layer 60 (the second semiconductor regions 62). It is desirable for the germanium concentration of the silicon-germanium film 81 to be in a range of 5 through 40% in order to suppress defects.

It is desirable for at least the uppermost surface of the sidewall insulating film 43 to be formed of a silicon nitride film resistant to a pretreatment for forming the silicon-germanium film 81.

Figure 8:
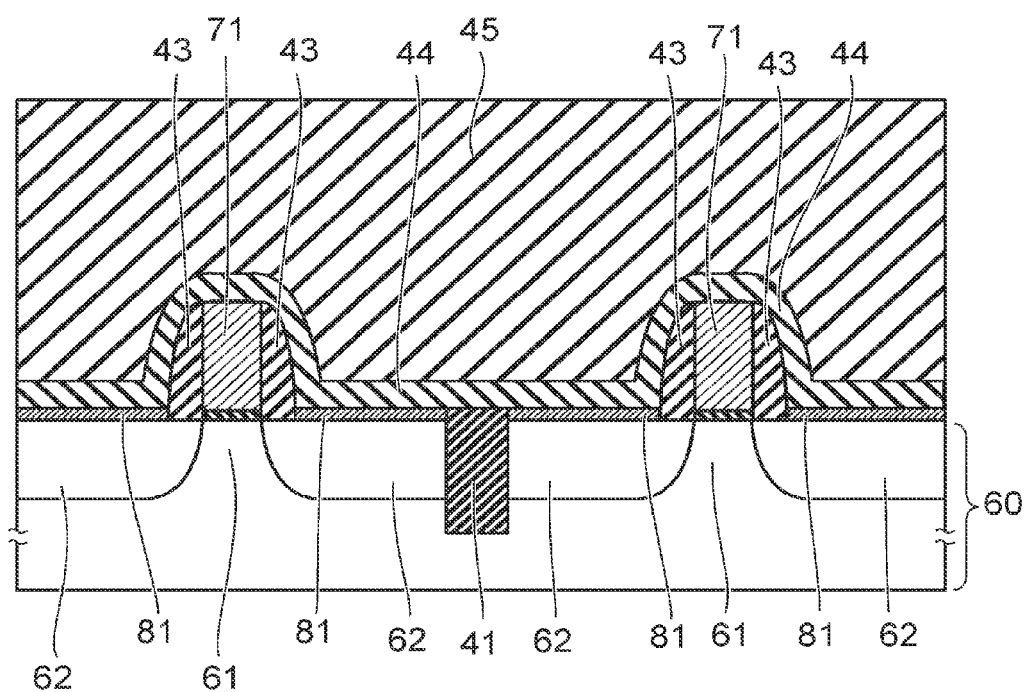

Then, as shown in FIG. 8, the insulating film 44 is formed on the silicon-germanium film 81, the sidewall insulating film 43, and the gate electrode 71, and then the inter-layer insulating layer 45 is formed on the insulating film 44.

For example, before forming the inter-layer insulating layer 45, the stacked body 100 and the columnar sections CL are formed in other areas on the substrate 10. The inter-layer insulating layer 45 is formed on the semiconductor layer 60 of the control section 2. The inter-layer insulating layer 45 reduces the step between the stacked body 100 and the control section 2.

Figure 9:
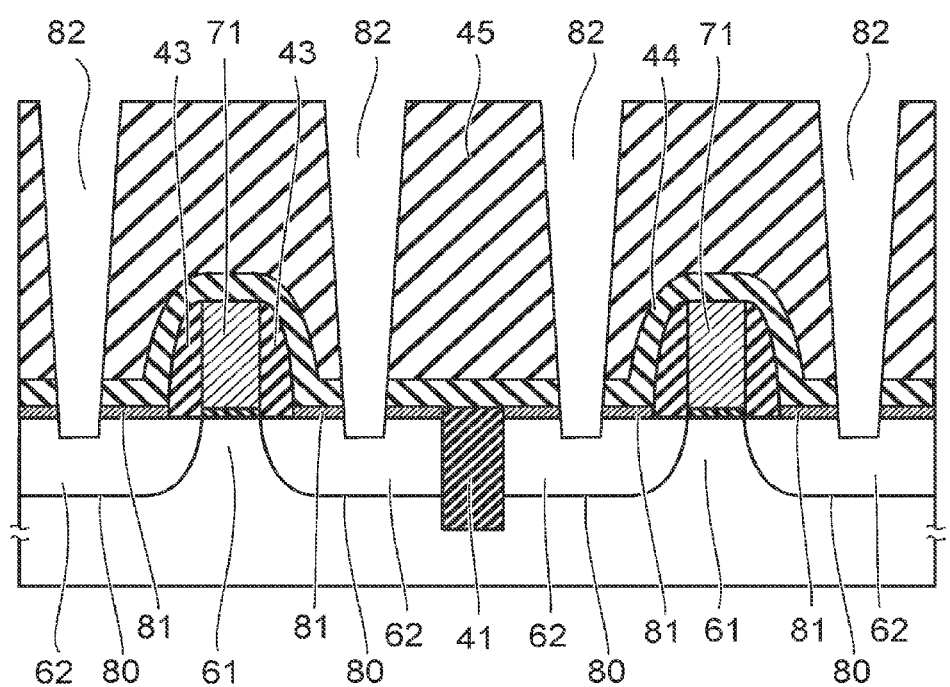

Then, as shown in FIG. 9, contact holes 82 are formed in the inter-layer insulating layer 45 by, for example, a reactive ion etching (RIE) method. The contact holes 82 penetrate the inter-layer insulating layer 45, the insulating film 44, and the silicon-germanium film 81, and reach the second semiconductor region 62. The contact hole 82 does not reach the p-n junction between the second semiconductor region 62 and the first semiconductor region 61.

In etching for forming the contact holes 82 in the inter-layer insulating layer 45, the insulating film (e.g., a silicon nitride film) 44 different in material from the inter-layer insulating layer (e.g., a silicon oxide film) 45 functions as an etching stopper.

The silicon-germanium films 81 are removed by an etching through the contact holes 82.

The silicon-germanium films 81 are etched in a condition in which the selectivity is sufficiently ensured with respect to the inter-layer insulating layer (the silicon oxide film) 45, the insulating film (the silicon nitride film) 44, and the semiconductor layer (the silicon layer) 60. The silicon-germanium films 81 are etched by a dry etching process using an HCl gas, or a wet etching process using $HNO_3$.

Figure 10:
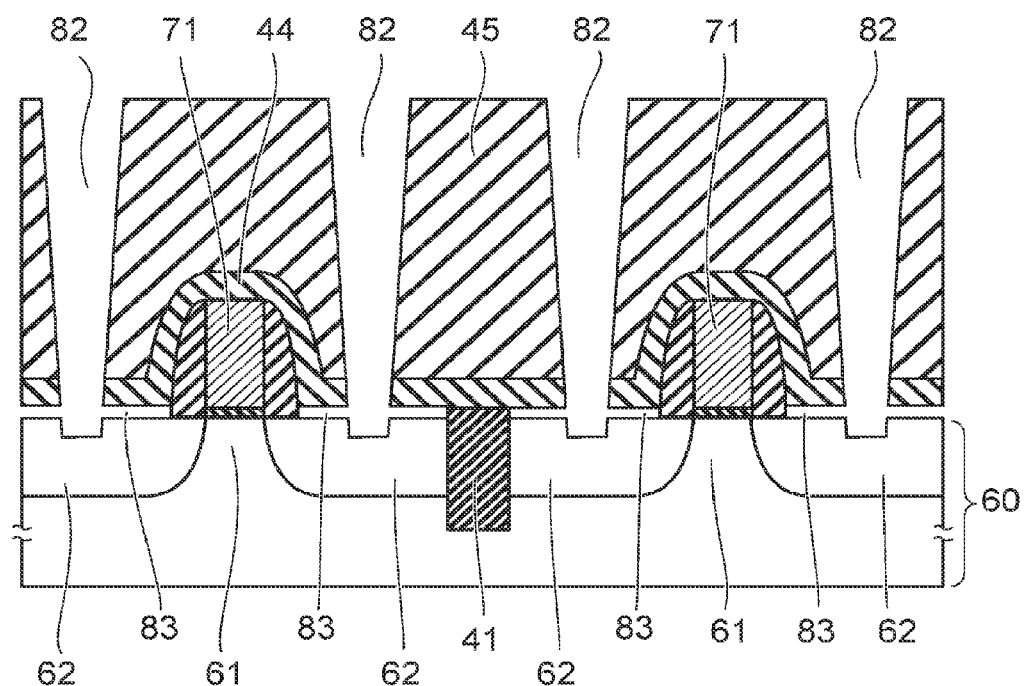

The silicon-germanium films 81 are removed, and gaps 83 are formed between the second semiconductor regions 62 and the insulating film 44 as shown in FIG. 10. Each of the gaps 83 is formed in the periphery of the lower end portion of the contact hole 82, and communicates with the contact hole 82.

Figure 11:
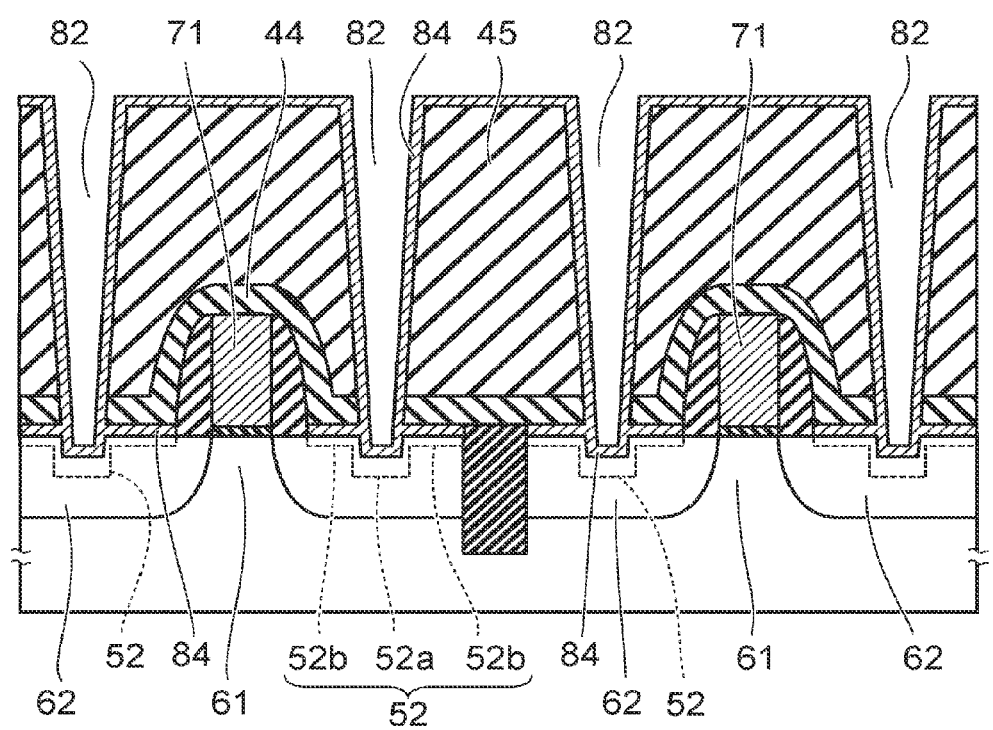

Then, a metal film 84 is formed in the sidewalls and the bottom portions of the contact holes 82 as shown in FIG. 11. The metal film 84 is, for example, a nickel film or a cobalt film. The metal film 84 is formed by, for example, a chemical vapor deposition (CVD) method, or an atomic layer deposition (ALD) method.

The metal film 84 is also formed in the gaps 83 communicating with the contact holes 82. The metal film 84 formed on the bottoms of the contact holes 82 and the metal film formed in the gaps 83 have contact with the second semiconductor regions 62.

After forming the metal film 84, the metal of the metal film 84 and the silicon of the second semiconductor regions 62 are reacted with each other by a thermal annealing to form the metal silicide films 52. The metal silicide films 52 are each formed in a part where the metal film 84 and the second semiconductor region 62 have contact with each other. In FIG. 11, the bottom of each of the metal silicide film 52 is schematically shown by a dotted line.

The metal silicide film is not formed on the sidewall of the contact hole 82 where the metal film 84 has contact with the inter-layer insulating layer 45 or the insulating film 44. The metal film 84 not yet reacted with silicon is removed by, for example, a chemical treatment.

Subsequently, the contact electrodes 72 shown in FIG. 5 are formed in the respective contact holes 82. The lower end portion of the contact electrode 72 has contact with the metal silicide film 52. The metal silicide film 52 reduces the parasitic resistance between the contact electrode 72 and the second semiconductor region (the source region or the drain region) 62.

As a method different from the embodiment, there can be cited a method of forming the second semiconductor regions 62 when forming the metal silicide films 52, and then, modifying the surfaces of the second semiconductor regions 62 into the metal silicide film before forming the inter-layer insulating layer 45 and the contact holes 82. On this occasion, after forming the metal silicide films on the surfaces of the second semiconductor regions 62, the stacked body 100 is stacked in the cell array area, then the columnar sections CL are formed to the stacked body 100, and then the inter-layer insulating layer 45 is formed in the area in which the control section 2 is to be formed.

In some cases, the process of forming the columnar sections CL of the memory cell array 1 is accompanied by a high-temperature thermal annealing, and for example, the process of forming the semiconductor film 20 is required to perform a thermal annealing at about 1000° C. in some cases. The metal silicide is generally less resistant to such a high temperature, and therefore, it is not desirable to form the metal silicide film in the control section 2 prior to the columnar section CL.

Further, as another method different from the embodiment, there can be cited a method of forming the memory cell array 1, and then forming the inter-layer insulating layer 45, then forming the contact holes 82 reaching the second semiconductor regions 62 in the inter-layer insulating layer 45, and then changing the surfaces of the second semiconductor regions 62 exposed on the bottoms of the contact holes 82 into the metal silicide films. However, in this case, the part to be changed into the metal silicide film is the region corresponding to the bottom area of the contact hole 82, and the parasitic resistance reduction effect is not significant.

Therefore, according to the embodiment, the silicon-germanium films 81, for example, as the sacrifice films are formed on the surfaces of the second semiconductor regions 62 as shown in FIG. 7B instead of the metal silicide films, and then the stacked body 100, the columnar sections CL, and the inter-layer insulating layer 45 are formed. The silicon-germanium films 81 are resistant to the high-temperature thermal annealing accompanying the process of forming the columnar sections CL.

Subsequently, as shown in FIG. 9, the contact holes 82 reaching the silicon-germanium films 81 are formed in the inter-layer insulating layer 45, and then the silicon-germanium films 81 are removed through the contact holes 82 (FIG. 10).

Therefore, the gap 83, in which the metal film can be formed so as to have contact with the second semiconductor region 62, is formed not only in the bottom of the contact hole 82, but also in the periphery of the lower end portion of the contact hole 82.

Subsequently, as shown in FIG. 11, the metal film 84 formed in the gap 83 located on the bottom of the contact hole 82 and the periphery of the bottom and the second semiconductor region 62 are reacted with each other to thereby form the metal silicide film 52 as shown in FIG. 5. The metal silicide film 52 is formed after forming the elements (e.g., the semiconductor film 20) accompanied with a high-temperature annealing in the memory cell array 1, and is therefore not damaged by the heat.

Further, due to the process using the sacrifice films, even after forming the contact holes 82, the metal silicide film 52 can be formed on the surface of the second semiconductor region 62 not only on the bottom, but also in the periphery of the bottom of each of the contact holes 82. Due to the metal silicide film 52 having a larger area than the bottom area of each of the contact holes 82 (the contact electrodes 72), the parasitic resistance between the contact electrode 72 and the second semiconductor region 62 can dramatically be reduced. The reduction in parasitic resistance increases the ON current of the transistors 201 of the control section 2 to make the high-speed operation of the control section 2 possible.

While increasing the total area of the metal silicide film 52 due to the second part 52b provided in the periphery of the lower end portion of the contact electrode 72, the second part 52b is kept further from the p-n junction 80 on the bottom of the second semiconductor region 62 than the first part 52a. Since the region including metal is kept away from the p-n junction 80, it is possible to make it difficult for the metal to reach the p-n junction 80 even if the metal is diffused, and thus, the junction leakage current can be suppressed.

The depth of the silicide reactive layer, that is, the position of the bottom of the second part 52b, can be controlled using the film thickness of the silicon-germanium film 81 grown on the surface of the second semiconductor region 62. The position of the bottom of the first part 52a immediately below the contact electrode 72 can be controlled by controlling the position of the bottom of the contact hole 82, that is, the etch stop timing (stop position) of the contact hole 82. Although the control of the etch stop position of the contact hole 82 having a high aspect ratio is difficult in some cases, even in such cases, the second part 52b can easily be kept away from the p-n junction 80 by the film thickness control of the silicon-germanium film 81, and thus, the possibility of the junction leakage can be reduced.

In the metal silicide film 52, since the contact with the contact electrode 72 is mainly borne by the first part 52a, it is desirable for the first part 52a to be thicker than the second part 52b. The thickness of the first part 52a depends on the film thickness of the metal film 84 formed on the bottom of the contact hole 82 in the process shown in FIG. 11.

The thickness of the second part 52b depends on the film thickness of the metal film 84 formed in the gap 83 shown in FIG. 10, namely the film thickness of the silicon-germanium film 81 formed on the surface of the second semiconductor region 62. By suppressing the film thickness of the silicon-germanium film 81 to a small value, it is possible to suppress the silicide reactive amount in the depth direction to thereby keep the bottom of the second part 52b further from the p-n junction 80 than the bottom of the first part 52a.

Figure 12:
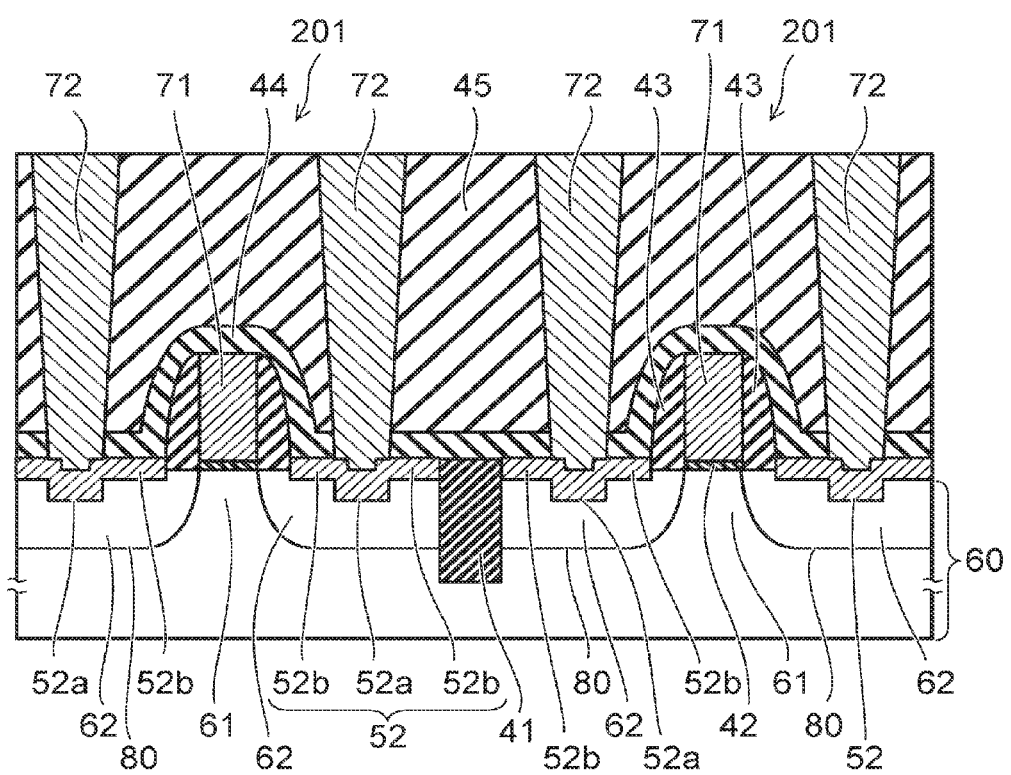
FIG. 12 is a schematic cross-sectional view of a transistor of a control section of a second embodiment.

FIG. 12 is a schematic cross-sectional view of the control section of a second embodiment.

In the second embodiment, the metal silicide film 52 also has the first part 52a and the second part 52b similarly to the first embodiment shown in FIG. 5. The first part 52a is provided between the bottom of the lower end portion of the contact electrode 72 and the second semiconductor region 62. The first part 52a is located in an area overlapping the contact electrode 72 viewed from above. The second part 52b is provided on the surface of the second semiconductor region 62 in an area between the first part 52a and the gate electrode 71.

The second part 52b is provided at a position shallower than the first part 52a, and the bottom of the second part 52b is located at a position shallower than the bottom of the first part 52a. The first part 52a and the second part 52b are integrally provided continuously with a step. The bottom of the first part 52a and the bottom of the second part 52b are located in the second semiconductor region 62 to have contact with the second semiconductor region 62. The bottom of the second part 52b is located further from the p-n junction on the bottom of the second semiconductor region 62 than the bottom of the first part 52a.

The first part 52a is provided immediately below the contact electrode 72 to have contact with the bottom of the lower end portion of the contact electrode 72. The second part 52b surrounds the periphery of the side surface of the lower end portion of the contact electrode 72, and has contact with the side surface of the lower end portion of the contact electrode 72. The first part 52a is thicker than the second part 52b.

The bottom of the contact electrode 72 of the second embodiment shown in FIG. 12 is located upper on the inter-layer insulating layer 45 side than the bottom of the contact electrode 72 of the first embodiment shown in FIG. 5.

The bottom of the contact electrode 72 of the first embodiment is located lower on the semiconductor layer 60 side than the boundary between the first semiconductor region (the channel region) 61 and the gate insulating film 42. In contrast, the bottom of the contact electrode 72 of the second embodiment is located at the same height as the boundary between the first semiconductor region 61 and the gate insulating film 42, or at a higher position than the boundary.

Then, a forming method of the control section of the second embodiment will be described with reference to FIG. 13 through FIG. 15.

The method proceeds to the process shown in FIG. 8 of forming the inter-layer insulating layer 45 on the silicon-germanium films 81, the sidewall insulating films 43, and the gate electrodes 71 via the insulating film 44 in substantially the same manner as in the first embodiment described above.

Figure 13:
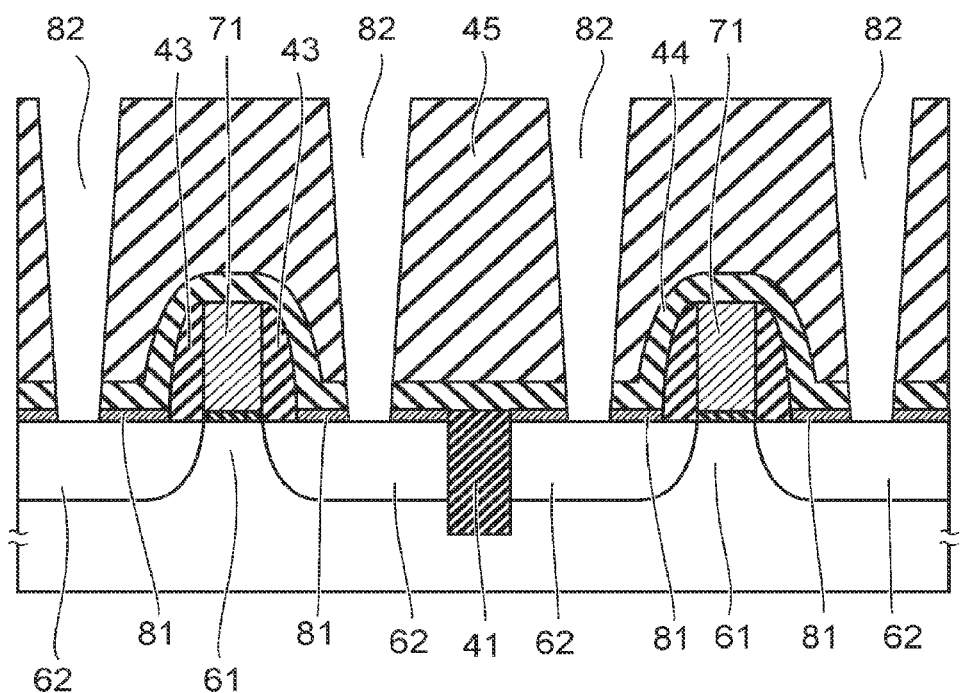
FIGS. 13 to 15 are schematic cross-sectional views showing a method for manufacturing the transistor of the second embodiment.

Subsequently, as shown in FIG. 13, the contact holes 82 are formed in the inter-layer insulating layer 45. The contact holes 82 penetrate the inter-layer insulating layer 45, the insulating film 44, and the silicon-germanium film 81, and reach the second semiconductor region 62. The etching process is controlled so that the bottom of each of the contact holes 82 stops at the surface of the second semiconductor region 62 or a position slightly deeper then the surface.

Then, similarly to the first embodiment, the silicon-germanium films 81 are removed by the etching through the contact holes 82.

Figure 14:
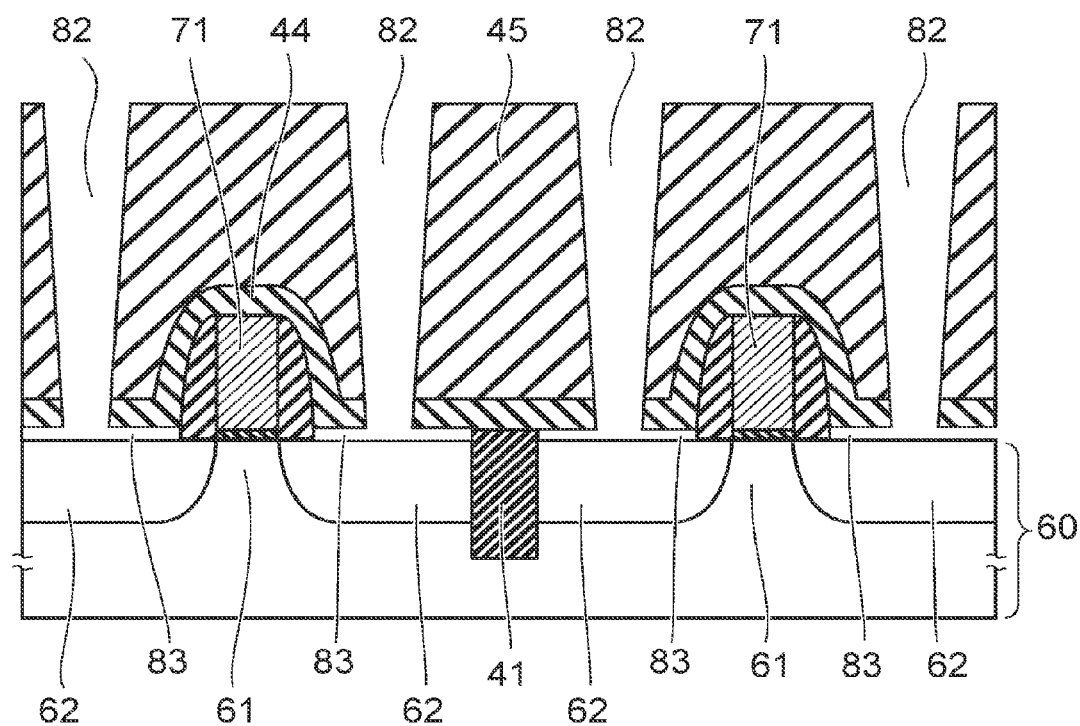

The silicon-germanium films 81 are removed, and the gaps 83 communicating with the respective contact holes 82 are formed between the second semiconductor regions 62 and the insulating film 44 as shown in FIG. 14.

Figure 15:
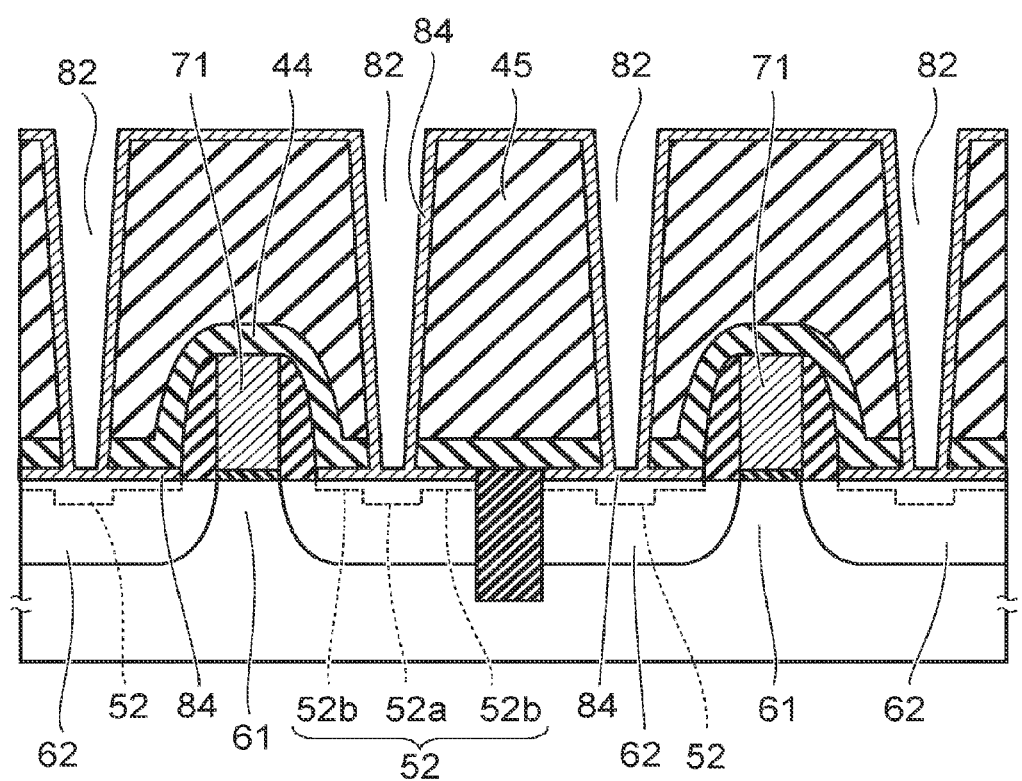

Then, the metal film 84 is formed in the sidewalls and the bottoms of the contact holes 82 as shown in FIG. 15. The metal film 84 is also formed in the gaps 83. The metal film 84 formed on the bottoms of the contact holes 82 and in the gaps 83 has contact with the surfaces of the second semiconductor regions 62.

After forming the metal film 84, the metal of the metal film 84 and the silicon of the second semiconductor regions 62 are reacted with each other by a thermal annealing to form the metal silicide films 52. The metal silicide films 52 are each formed in a part where the metal film 84 and the second semiconductor region 62 have contact with each other. In FIG. 15, the bottom of each of the metal silicide film 52 is schematically shown by a dotted line. The metal film 84 not yet reacted with silicon is removed by, for example, a chemical treatment.

Subsequently, the contact electrodes 72 shown in FIG. 12 are formed in the respective contact holes 82. The lower end portion of the contact electrode 72 has contact with the metal silicide film 52. The metal silicide film 52 reduces the parasitic resistance between the contact electrode 72 and the second semiconductor region (the source region or the drain region) 62.

In the second embodiment, the gap 83 (FIG. 14), in which the metal film can be formed so as to have contact with the second semiconductor region 62, is also formed not only in the bottom of the contact hole 82, but also in the periphery of the bottom.

Subsequently, as shown in FIG. 15, the metal film 84 formed in the gap 83 located on the bottom of the contact hole 82 and the periphery of the bottom and the second semiconductor region 62 are reacted with each other to thereby form the metal silicide film 52 as shown in FIG. 12. The metal silicide film 52 is formed after forming the elements (e.g., the semiconductor film 20) accompanied with a high-temperature annealing in the memory cell array 1, and is therefore not damaged by the heat.

Further, due to the process using the sacrifice films (the silicon-germanium films 81), even after forming the contact holes 82, the metal silicide film 52 can be formed on the surface of the second semiconductor region 62 not only on the bottom, but also in the periphery of the bottom of each of the contact holes 82. Due to the metal silicide films 52 having a larger area than the bottom area of each of the contact electrodes 72), the parasitic resistance between the contact electrode 72 and the second semiconductor region 62 can dramatically be reduced. The reduction in parasitic resistance increases the ON current of the transistors 201 of the control section to make the high-speed operation of the control section possible.

While increasing the total area of the metal silicide film 52 due to the second part 52b provided in the periphery of the lower end portion of the contact electrode 72, the second part 52b is kept further from the p-n junction 80 on the bottom of the second semiconductor region 62 than the first part 52a. By keeping the region including metal away from the p-n junction 80, the junction leakage current can be suppressed.

In the second embodiment, the position of the bottom of the contact hole 82 is set shallower than the position of the bottom of the contact hole 82 in the first embodiment. Therefore, in the second embodiment, the position of the bottom of the first part 52a of the metal silicide film 52 formed below the bottom of the contact hole 82 can be kept further from the p-n junction 80 on the bottom of the second semiconductor region 62 than in the first embodiment. Thus, the metal of the first part 52a is made difficult to reach the p-n junction 80 to thereby suppress the junction leakage current.

Figure 16:
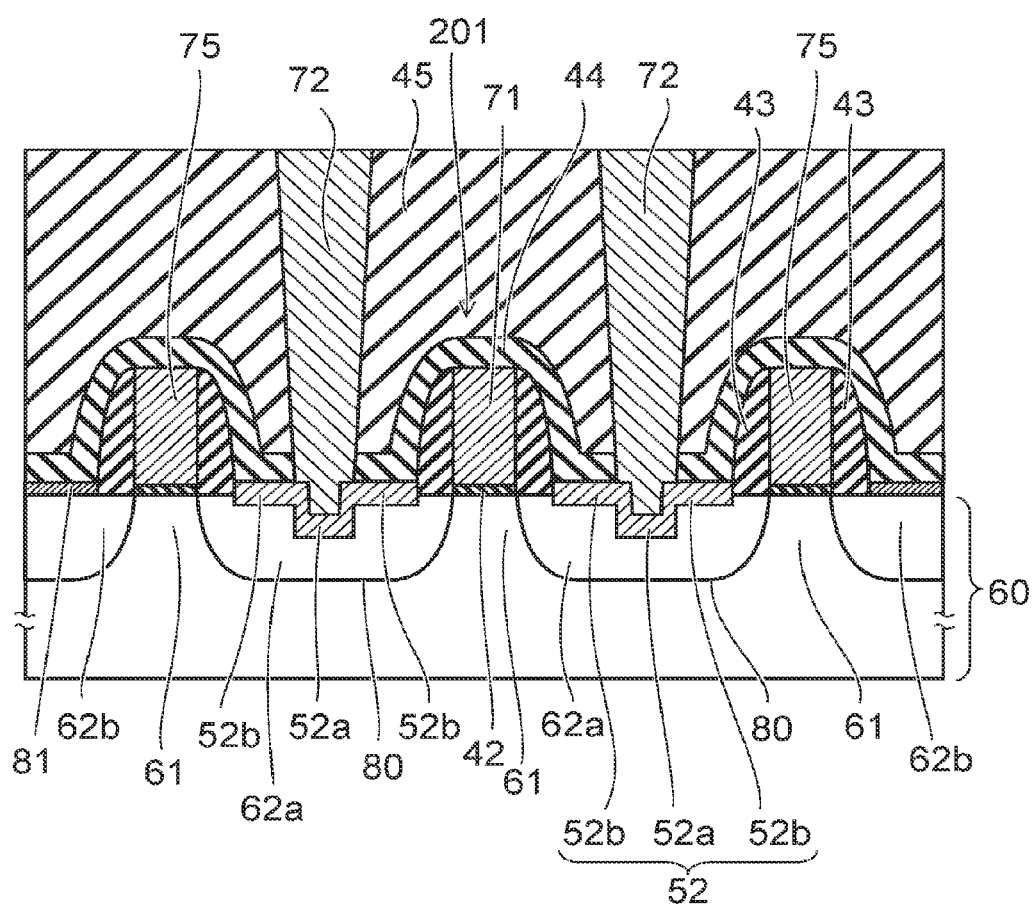
FIG. 16 is a schematic cross-sectional view of a transistor of a control section of a third embodiment.

Then, FIG. 16 is a schematic cross-sectional view of the control section of a third embodiment.

Figure 17:
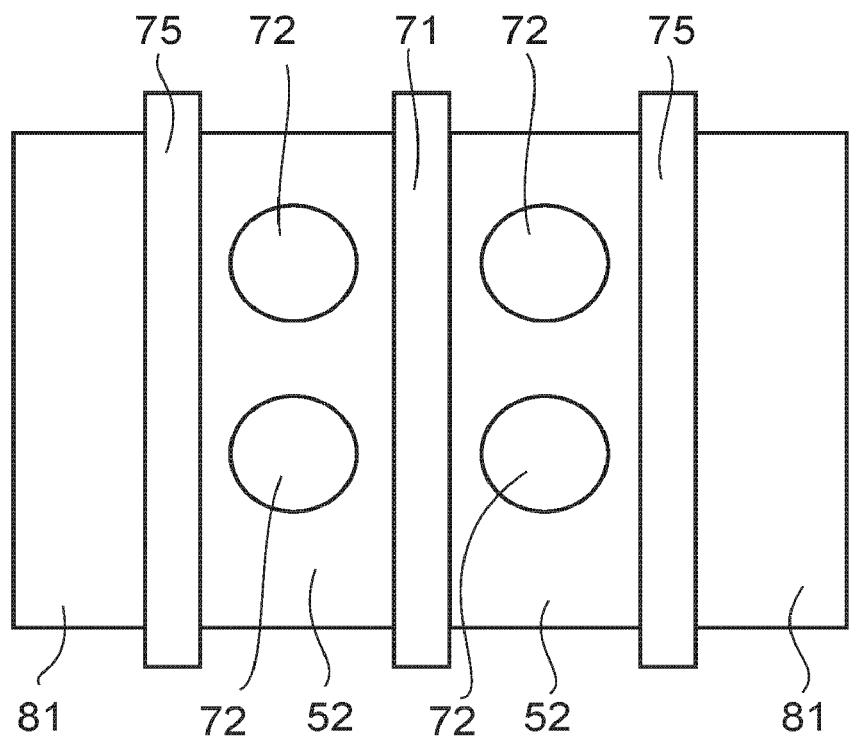
FIG. 17 is a schematic plan view showing a planar layout of the transistor of the third embodiment.

FIG. 17 is a schematic plan view showing a planar layout of some elements in the control section of the third embodiment.

The control section of the third embodiment includes the transistors 201 having substantially the same structure as in the first embodiment or the second embodiment. FIG. 16 illustrates an example of a structure in which the position of the bottom of the contact electrode 72 is located at a position deeper than the surface of the first semiconductor region (the channel region) 61 similarly to, for example, the first embodiment.

The surface of the semiconductor layer 60 is provided with a plurality of second semiconductor regions 62a, 62b. The second semiconductor regions 62a, 62b have the p-n junctions with the first semiconductor regions 61, respectively.

The first regions 62a of the second semiconductor regions are provided lateral to the gate electrode 71 of the transistor 201 in the gate length direction. A pair of first regions 62a are located on the both sides of the first semiconductor region 61 with respect to one transistor 201. One of the pair of first regions 62a functions as a drain region of the transistor 201, and the other of the pair of first regions 62a functions as a source region. The contact electrode 72 is provided on the first region 62a via the metal silicide film 52 similarly to the first embodiment.

A gate pattern 75 formed as a pattern simultaneously with the gate electrode 71 of the transistor 201 is provided lateral to the first region 62a.

As shown in FIG. 17, the gate electrode 71 and the gate pattern 75 extend in the gate width direction with the same line width, and are arranged side by side in the gate length direction at a constant pitch.

The gate electrode 71 of the transistor 201 is connected to the gate interconnection not shown, and desired potential control is performed on the gate electrode 71 on the one hand, the gate pattern 75 is not connected to the interconnection, and the potential of the gate pattern 75 is kept floating on the other hand. The gate pattern 75 is a dummy pattern, which does not function as the gate electrode of the transistor.

By patterning the gate pattern 75 as a dummy pattern at the position lateral to the gate electrode 71 instead of locating the gate electrode 71 used as the functional element of the transistor at the end, the shape deterioration of the gate electrode 71 can be suppressed.

The second region 62b of the second semiconductor regions provided at the position lateral to the gate pattern 75 on the opposite side to the transistor 201 does not function as the source region or the drain region. The metal silicide film 52 and the contact electrode 72 are not provided on the second region 62b.

On the surface of the second region 62b, there remains the sacrifice film (the silicon-germanium film) 81 formed in the process shown in FIG. 7B described above. The silicon-germanium films 81 are epitaxially grown on the entire surface of the second semiconductor regions 62 exposed and including the first region 62a and the second region 62b.

Further, the contact holes 82 shown in FIG. 9 are formed only on the first regions 62a and are not formed on the second regions 62b in the third embodiment shown in FIG. 16.

The silicon-germanium films 81 on the first regions 62a are removed through the contact holes 82, and the metal silicide films 52 are formed on the first regions 62a in the subsequent process.

Since the contact hole 82 is not formed on the silicon-germanium film 81 on the second region 62b, the silicon-germanium film 81 on the second region 62b is not removed, and remains on the surface of the second region 62b as shown in FIG. 16.

Therefore, in the control of the third embodiment, there exist the region where the metal silicide film 52 is provided on the second semiconductor region 62a, and the region where the silicon-germanium film 81 is provided on the second semiconductor region 62b. The region where the metal silicide film 52 is provided and the region where the silicon-germanium film 81 is provided are separated in the gate length direction across the dummy gate pattern 75 from each other.

Figure 18:
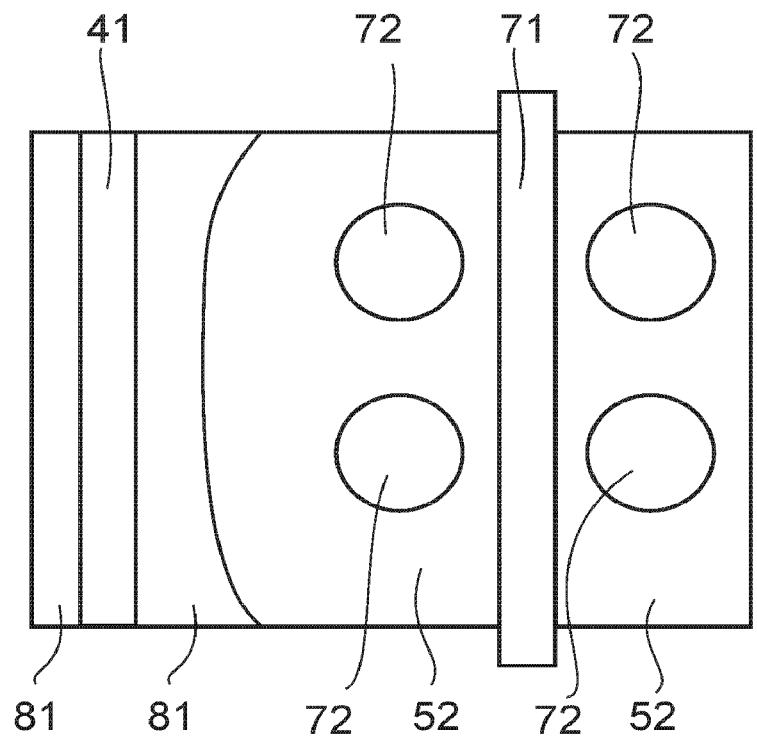
FIG. 18 is a schematic plan view showing a planar layout of the transistor of the embodiment.

FIG. 18 corresponds to a schematic plan view of an area surrounded by a dotted line in FIG. 6.

The distance between the forming position of the contact electrode 72, that is, the position of the contact hole 82, and the isolation film 41 in FIG. 18 is longer than the distance between the position of the contact hole 82 and the isolation film 41 in FIG. 6.

It should be noted that at the position of the isolation film 41 shown in FIG. 18, it is possible to provided an element other than the isolation film 41 such as the gate pattern 75 similar to FIG. 17, or it is also possible to provided neither a pattern nor an element.

As shown in FIG. 18, the silicon-germanium film 81 located on the isolation film 41 side far from the position of the contact hole 82 remains unremoved in some cases. The region where the metal silicide film 52 is provided and the region where the silicon-germanium film 81 is provided exist in a mixed manner so as to have contact with each other.

Figure 19:
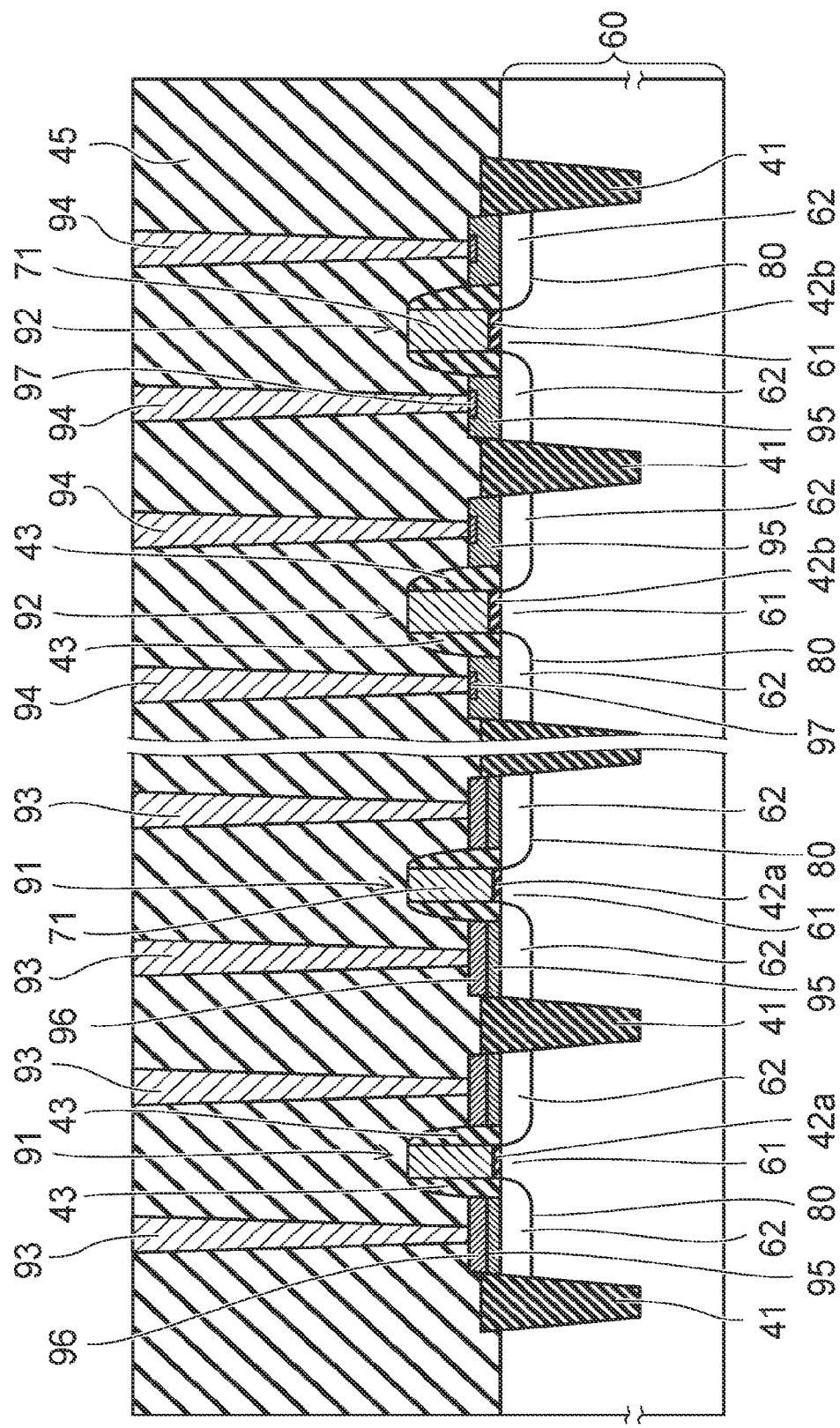
FIG. 19 is a schematic cross-sectional view of a transistor of a control section of a fourth embodiment.

Then, FIG. 19 is a schematic cross-sectional view of transistors of a control section of a fourth embodiment.

The control section of the fourth embodiment has first transistors 91 and second transistors 92.

Firstly, the first transistors 91 will be described.

The first transistors 91 are provided on the semiconductor layer 60. The memory cell array 1 described above, the first transistors 91, and the second transistor 92 described later are provided on the same substrate 10. The semiconductor layer 60 is provided on the surface side of the substrate 10, and includes, for example, silicon as a principal component.

The first transistors 91 each have the first semiconductor region 61, the second semiconductor regions 62, a gate insulating film 42a, the gate electrode 71, semiconductor films 95, metal silicide films 96, and contact electrodes 93.

The first semiconductor region 61 and the second semiconductor regions 62 are provided on the surface side of the semiconductor layer 60, and include silicon as a principal component. The first semiconductor region 61 is provided between a pair of second semiconductor regions 62. One of the pair of second semiconductor regions 62 functions as a drain region, and the other of the pair of second semiconductor regions 62 functions as a source region.

The first semiconductor region 61 is of the p-type or the n-type, the second semiconductor regions 62 are of the n-type or the p-type as the opposite type to the first semiconductor region 61, and the first semiconductor region 61 and the second semiconductor regions 62 are provided with a p-n junction.

The second semiconductor regions 62 are provided on a region (layer) having the opposite conductivity type to the second semiconductor regions 62, and the bottom of each of the second semiconductor regions 62 also has the p-n junction with the region (layer) below the bottom.

The first transistors 91 adjacent to each other are separated by the isolation film 41 provided on the surface side of the semiconductor layer 60.

The gate electrode 71 is provided on the first semiconductor region 61 via the gate insulating film 42a. The sidewall insulating films 43 are respectively provided on the both sidewalls of the gate electrode 71, the sidewalls being located in the gate length direction.

The semiconductor films 95 are provided on the respective second semiconductor regions 62. The semiconductor film 95 is a silicon film including, for example, silicon as a principal component.

The respective metal silicide films 96 are provided on the semiconductor films 95. The metal silicide film 96 is provided on the entire surface of the semiconductor film 95. The metal silicide film 96 is, for example, a nickel silicide film or a cobalt silicide film.

The inter-layer insulating layer 45 is provided on the semiconductor layer 60.

The inter-layer insulating layer 45 covers the metal silicide films 96, the sidewall insulating films 43, and the gate electrodes 71.

The contact electrodes 93 are provided in the inter-layer insulating layer 45. The contact electrodes 93 extend in a thickness direction of the inter-layer insulating layer 45 toward the metal silicide film 96. The lower end portion of the contact electrode 93 has contact with the metal silicide film 96. The contact electrode 93 does not penetrate the metal silicide film 96 and the semiconductor film 95, and does not have direct contact with the second semiconductor region 62.

The metal silicide film 96 spreads in a peripheral area of the lower end portion of the contact electrode 93.

The second semiconductor region 62 is electrically connected to the contact electrode 93 via the semiconductor film 95 and the metal silicide film 96. The contact electrodes 93 and the gate electrode 71 are electrically connected to an upper interconnection layer not shown provided on the inter-layer insulating layer 45.

Then, the second transistors 92 will be described.

The second transistors 92 have the first semiconductor region 61, the second semiconductor regions 62, a gate insulating film 42b, the gate electrode 71, the semiconductor film 95, metal silicide films 97, and contact electrodes 94.

The second transistors 92 adjacent to each other, and the first transistor 91 and the second transistor 92 are separated by the isolation film 41 provided on the surface side of the semiconductor layer 60.

The gate electrode 71 is provided on the first semiconductor region 61 via the gate insulating film 42b. The sidewall insulating films 43 are respectively provided on the both sidewalls of the gate electrode 71, the sidewalls being located in the gate length direction.

The semiconductor films 95 are provided on the respective second semiconductor regions 62. The respective metal silicide films 97 are provided on the semiconductor films 95.

The inter-layer insulating layer 45 is provided on the semiconductor layer 60.

The inter-layer insulating layer 45 covers the metal silicide films 97, the semiconductor films 95, the sidewall insulating films 43, and the gate electrode 71 of each of the second transistors 92.

The contact electrodes 94 are provided in the inter-layer insulating layer 45. The contact electrodes 94 extend in a thickness direction of the inter-layer insulating layer 45 toward the metal silicide film 97. The lower end portion of the contact electrode 94 has contact with the metal silicide film 97. The contact electrode 94 does not penetrate the metal silicide film 97 and the semiconductor film 95, and does not have direct contact with the second semiconductor region 62.

The second semiconductor region 62 of the second transistor 92 is electrically connected to the contact electrode 94 via the semiconductor film 95 and the metal silicide film 97. The contact electrodes 94 and the gate electrode 71 are electrically connected to an upper interconnection layer not shown provided on the inter-layer insulating layer 45.

A voltage higher than the voltage applied to the first transistor 91 is applied to the second transistor 92. The gate insulating film 42b of the second transistor 92 is thicker than the gate insulating film 42a of the first transistor 91, and the second transistor 92 is higher in withstand voltage than the first transistor 91.

Among the first transistors 91 and the second transistors 92, at least the second transistors 92 are connected to the bit lines BL, the source layer SL, the electrode layer 70 of the memory cell array 1 shown in FIG. 2, via the contact electrodes 94 and the upper layer interconnection.

The first transistors 91, for example, are not directly connected to the memory cell array 1, and control an input-output operation between the semiconductor device and an external circuit.

The thickness of the metal silicide film 96 in the first transistors 91 is larger than the thickness of the metal silicide film 97 in the second transistors 92. The area (the area of the upper surface) of the metal silicide film 96 in the first transistors 91 is larger than the area (the area of the upper surface) of the metal silicide film 97 in the second transistors 92.

The metal silicide films 96 of the first transistor 91 are provided on the entire surface of the semiconductor film 95 on the one hand, and each of the metal silicide films 97 of the second transistors 92 is not provided on the entire surface of the semiconductor film 95, but is provided in a range substantially the same as the bottom area of the contact electrode 94.

The semiconductor films 95 of the second transistor 92 are thicker than the semiconductor films 95 of the first transistor 91.

Then, a forming method of the control section of the fourth embodiment will be described with reference to FIG. 20 through FIG. 24.

In the fourth embodiment, the first transistors 91 and the second transistors 92 are also formed on the substrate 10 prior to the memory cell array 1.

Figure 20:
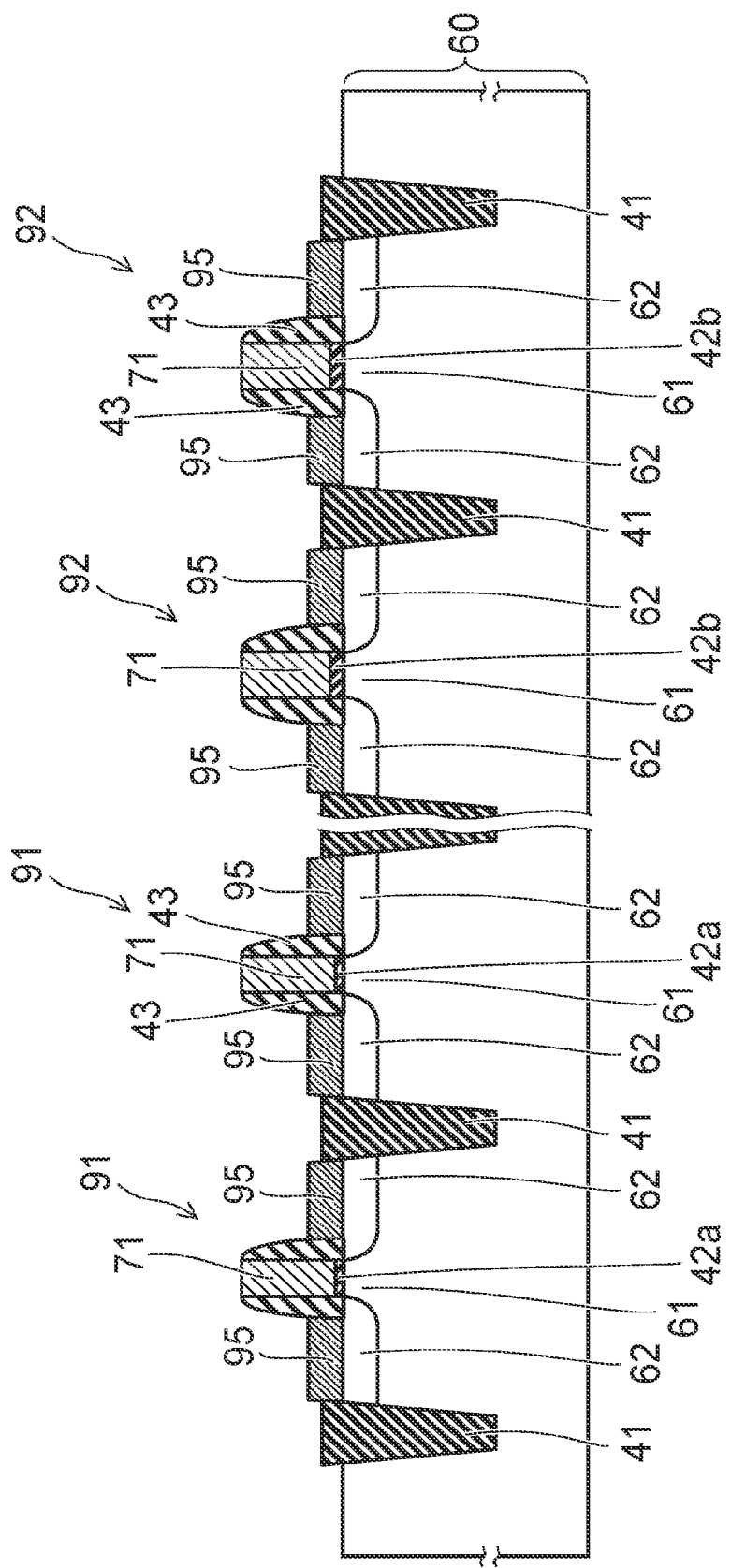
FIGS. 20 to 24 are schematic cross-sectional views showing a method for manufacturing the transistor of the fourth embodiment.

After forming the isolation areas 41 on the semiconductor layer 60 formed on the surface side of the substrate 10, the gate insulating films 42a, 42b, the gate electrodes 71, and the sidewall insulating films 43 are formed as shown in FIG. 20.

Subsequently, an impurity is injected on the surface of the semiconductor layer 60 in the areas located lateral to the gate electrode 71 in the gate length direction by, for example, an ion injection method. Due to a subsequent thermal annealing, the injected impurity is diffused and activated, and thus, the second semiconductor regions 62 are formed on the surface of the semiconductor layer 60. It should be noted that the thermal annealing for diffusing and activating the impurity is not required to be performed immediately after the ion injection. In the case in which the impurity has not yet been diffused at the time point of FIG. 20, the second semiconductor regions 62 shown in the drawing indicate the regions in which the second semiconductor regions 62 are to be formed.

Subsequently, the semiconductor films (silicon films) 95 are epitaxially grown on the surface of the second semiconductor regions 62. The upper surface of each of the semiconductor films is located at a higher level than the surface of the semiconductor layer 60.

Figure 21:
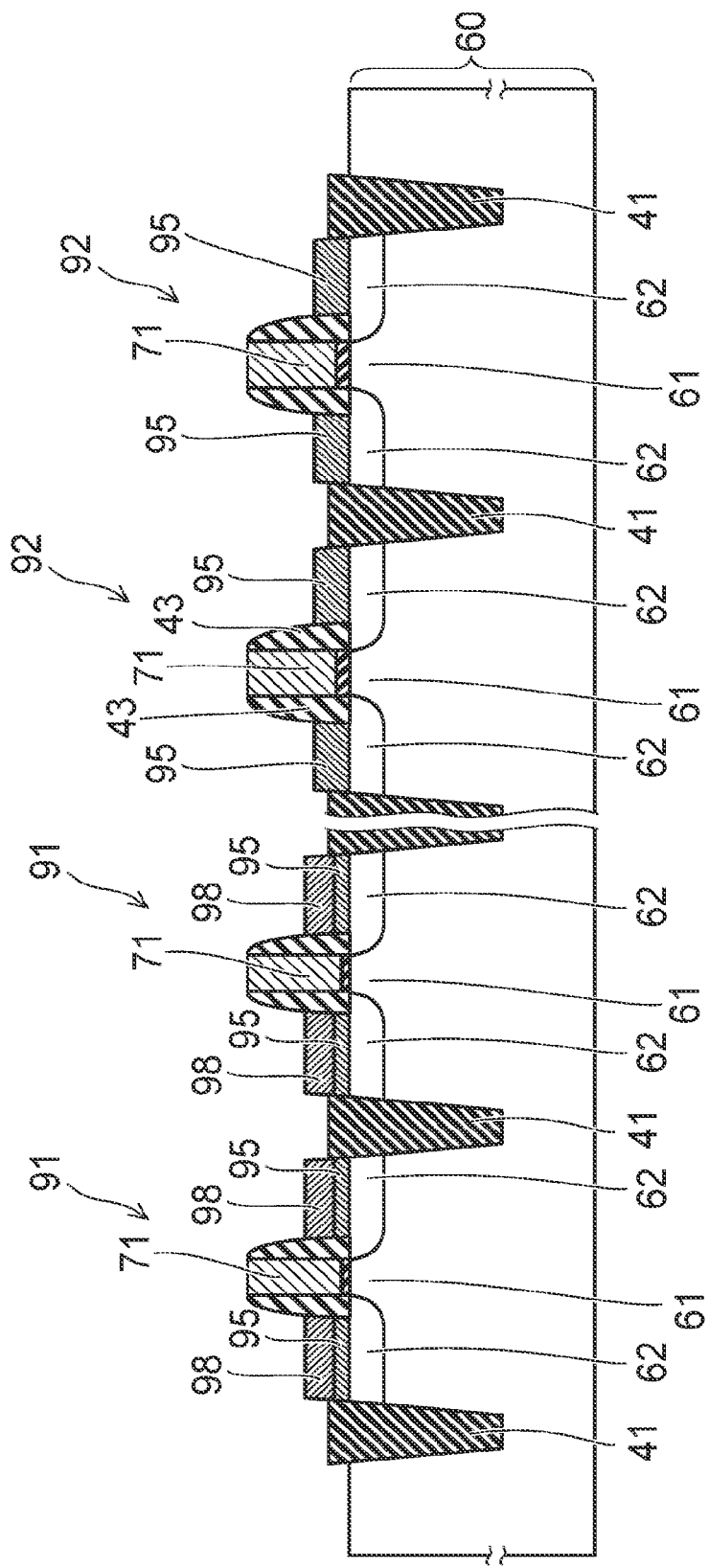

Then, a silicon-germanium film 98 is formed on the surface of each of the semiconductor films 95 of the first transistors 91 as shown in FIG. 21. The silicon-germanium film 98 is a sacrifice film to be removed in a subsequent process. The silicon-germanium film 98 is a film different in material from the semiconductor film 95 as a silicon film, and has etching selectivity with respect to the semiconductor film 95.

For example, the silicon-germanium film 98 having a thickness of several nanometers is epitaxially grown on each of the semiconductor films 95 of the first transistors 91. Therefore, the silicon-germanium film 98 has the same crystal orientation as the semiconductor film 95. It is desirable for the germanium concentration of the silicon-germanium film 98 to be in a range of 10 through 40% in order to suppress defects.

In the case of forming the silicon-germanium film 98 on each of the semiconductor films 95 of the first transistors 91, the areas in which the second transistors 92 are formed are covered with a mask layer, and therefore, the silicon-germanium film is not formed on each of the semiconductor films 95 of the second transistors 92.

After forming the silicon-germanium film 98 on each of the semiconductor films 95 of the first transistors 91, the mask layer covering the second transistors 92 is removed. The mask layer is, for example, a silicon nitride film. Therefore, it is desirable that at least the uppermost surface of the sidewall insulating films 43 is formed of a silicon oxide film in order to prevent the sidewall insulating films 43 from being etched when removing the mask layer as the silicon nitride film.

Figure 22:
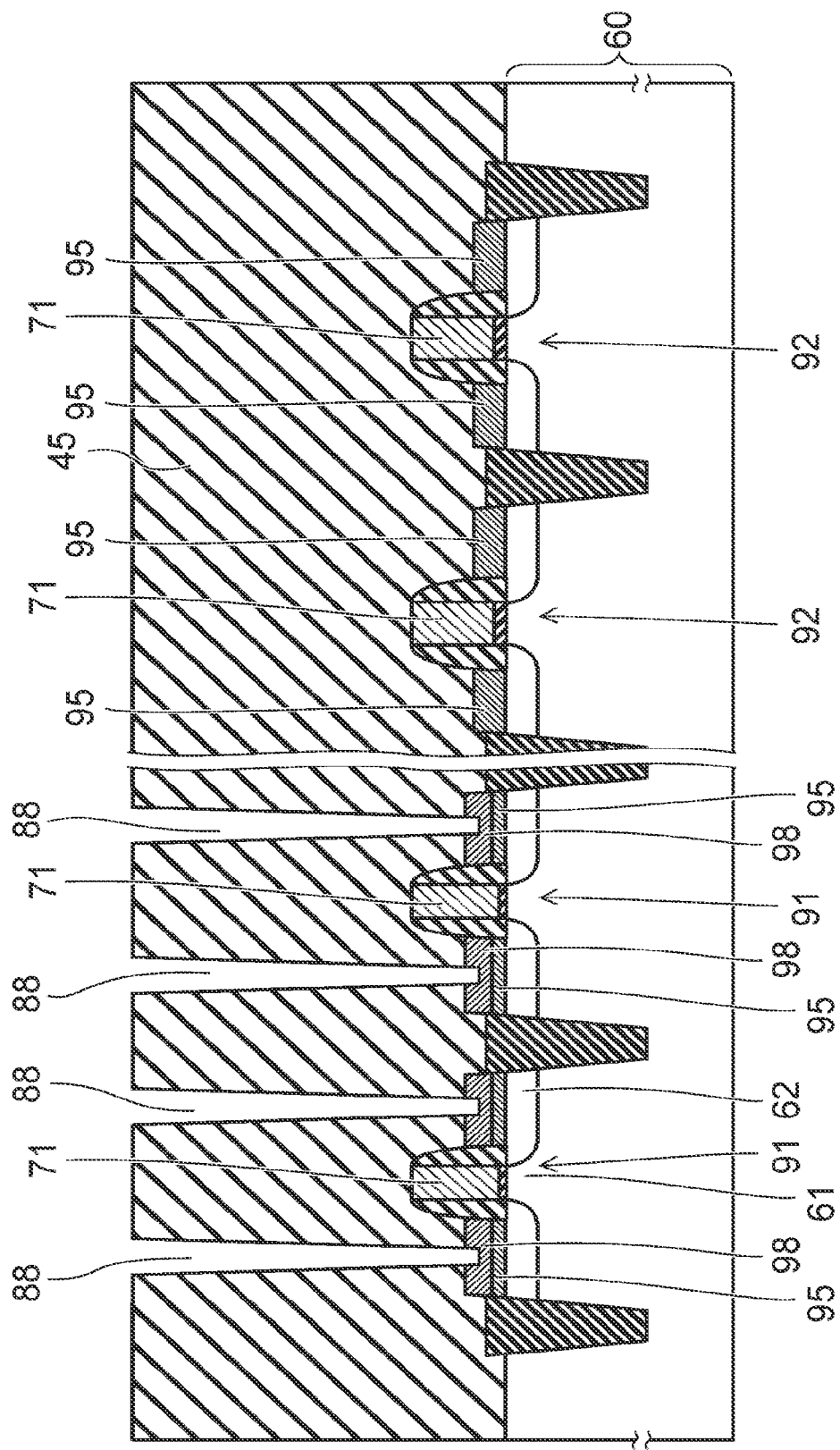

Subsequently, as shown in FIG. 22, the inter-layer insulating layer 45 is formed on the semiconductor layer 60 so as to cover the first transistors 91 and the second transistors 92.

For example, before forming the inter-layer insulating layer 45, the stacked body 100 and the columnar sections CL of the memory cell array 1 are formed in other areas on the substrate 10. The inter-layer insulating layer 45 is formed on the semiconductor layer 60 of the control section. The inter-layer insulating layer 45 reduces the step between the stacked body 100 and the control section.

Then, contact holes 88 are formed in the inter-layer insulating layer 45 in an area, in which the first transistors 91 are formed, by the RIE method. The contact holes 88 penetrate the inter-layer insulating layer 45 to reach the silicon-germanium film 98 provided on each of the semiconductor films 95 of the first transistors 91. In the RIE process, the inter-layer insulating layer 45 in the area in which the second transistors 92 are formed is covered with a mask layer.

The silicon-germanium films 98 are removed by etching through the contact holes 88.

The silicon-germanium films 98 are etched in a condition in which the selectivity is sufficiently ensured with respect to the inter-layer insulating layer (the silicon oxide film) 45, and the semiconductor films (the silicon films) 95. The silicon-germanium films 98 are etched by a dry etching process using an HCl gas, or a wet etching process using $HNO_3$.

Figure 23:
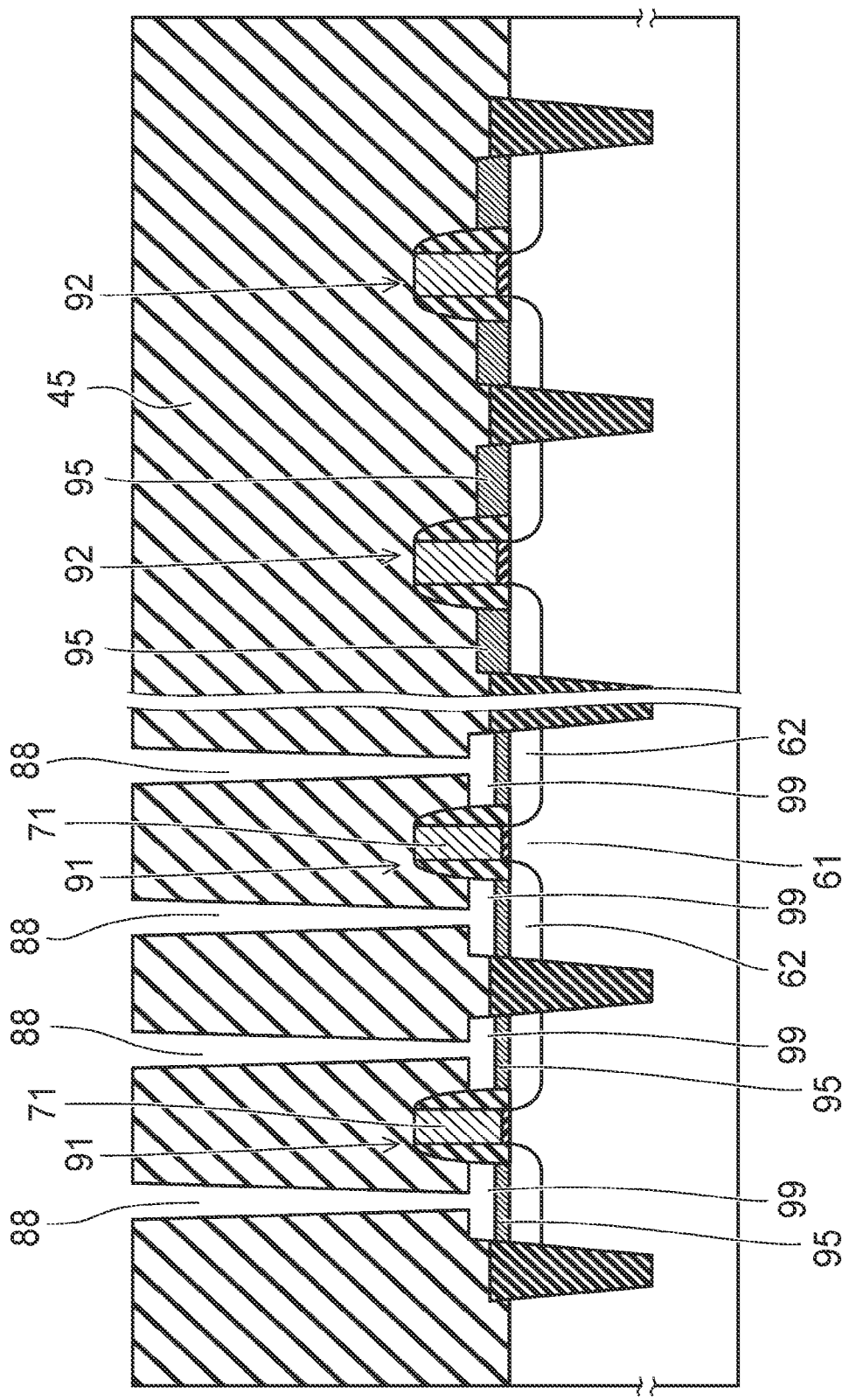

The silicon-germanium films 98 are removed, and a gap 99 is formed on each of the semiconductor films 95 of the first transistors 91 as shown in FIG. 23. The gap 99 communicates with the bottom of the contact hole 88.

Figure 24:
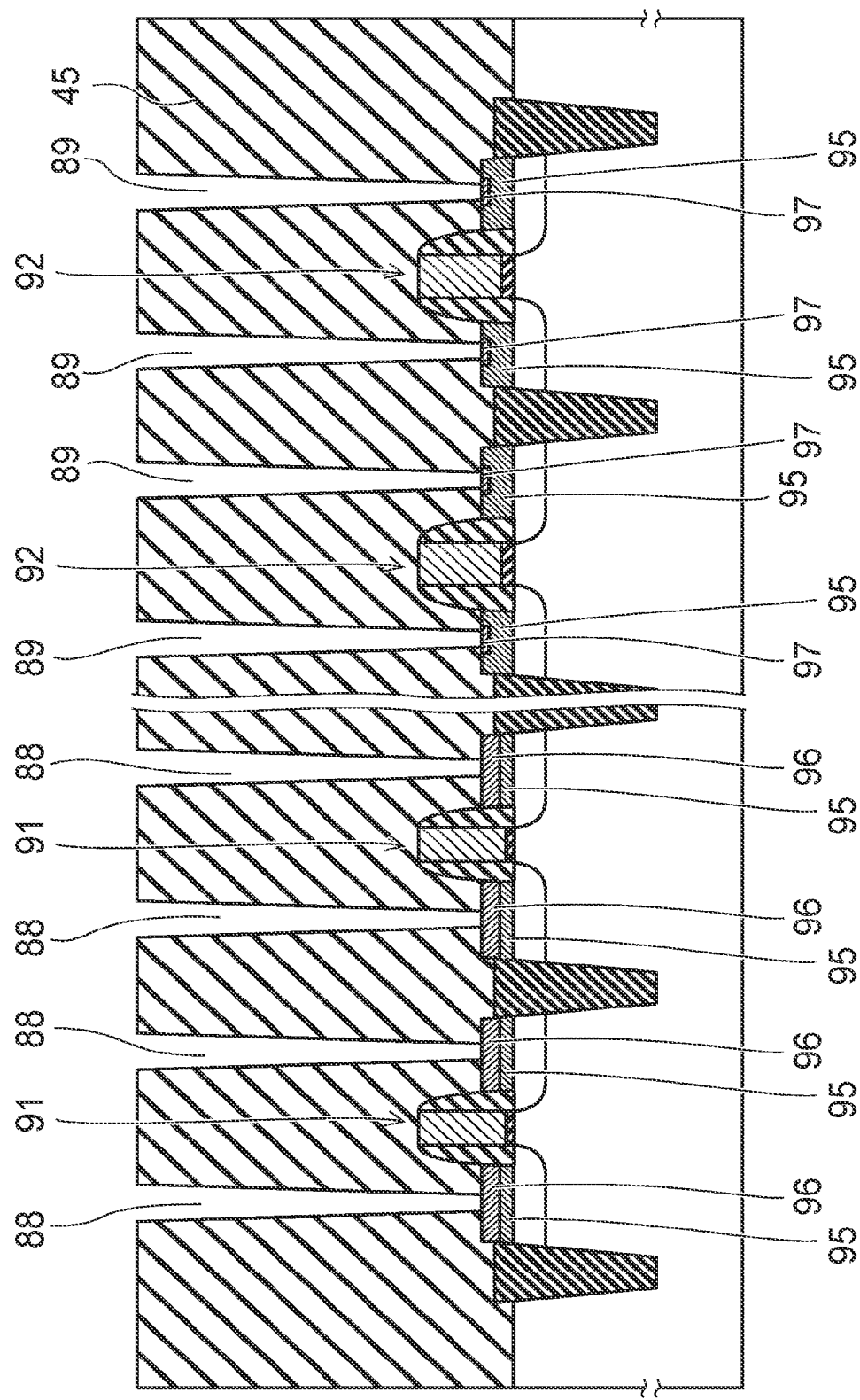

Subsequently, a metal film is formed on the sidewall of each of the contact holes 88 and in the gaps 99. The metal film in the gap 99 has contact with the semiconductor film 95. Subsequently, by a thermal annealing, the metal in the metal film and the silicon in the semiconductor film 95 are reacted with each other to form the metal silicide film 96 as shown in FIG. 24. The metal silicide film 96 is formed on each of the semiconductor films 95 of the first transistors 91.

Further, contact holes 89 are formed in the inter-layer insulating layer 45 in an area in which the second transistors 92 are formed, and the contact holes 89 reach the respective semiconductor films 95 of the second transistors 92. After the metal film is formed on the sidewall and the bottom of each of the contact holes 89, the metal in the metal film and the silicon in the semiconductor films 95 are reacted with each other by a thermal annealing. Due to this reaction, the metal silicide film 97 is formed on the bottom of each of the contact holes 89.

In the first transistors 91, due to the process using the sacrifice films (the silicon-germanium films 98), the metal film having contact with the semiconductor film 95 can be formed also in the periphery of the bottom of the contact hole 88. Therefore, it is possible to form the metal silicide film 96 also in the periphery of the bottom of the contact hole 88.

In contrast, in the second transistors 92, the metal film has contact with the semiconductor film 95 only on the bottom of the contact hole 89. Therefore, in the second transistors 92, the silicide reactive amount is small compared to the first transistors 91, and the area and the thickness, that is, the volume, of the metal silicide film 97 formed on each of the semiconductor films 95 of the second transistors 92 are smaller than the area and the thickness (the volume) of the metal silicide film 96 formed on each of the semiconductor films 95 of the first transistors 91.

The metal film not yet reacted existing in the contact holes 88 and the contact holes 89 is removed by, for example, a chemical treatment.

Subsequently, as shown in FIG. 19, the contact electrodes 93 having contact with the respective metal silicide films 96 are formed in the contact holes 88 of the first transistors 91, and the contact electrodes 94 reaching the respective metal silicide films 97 are formed in the contact holes 89 of the second transistors 92.

The metal silicide film 96 reduces the parasitic resistance between the contact electrode 93 and the second semiconductor region (the source region or the drain region) 62 in the first transistor 91. The metal silicide film 97 reduces the parasitic resistance between the contact electrode 94 and the second semiconductor region (the source region or the drain region) 62 in the second transistor 92.

The metal silicide films 96, 97 are formed after forming the elements (e.g., the semiconductor film 20) accompanied with a high-temperature annealing in the memory cell array 1, and is therefore not damaged by the heat.

Further, regarding the first transistors 91, due to the process using the sacrifice films, even after forming the contact holes 88, the metal silicide film 96 can be formed not only on the bottom of each of the contact holes 88, but also on the surface of the semiconductor film 95 in the periphery of the bottom. Due to the metal silicide films 96 each having a larger area than the bottom area of each of the contact holes 88 (the contact electrodes 93), the parasitic resistance between the contact electrode 93 and the second semiconductor region 62 can dramatically be reduced. The reduction in parasitic resistance increases the ON current of the first transistors 91, for which a higher speed operation is required compared to the second transistors 92, to make the high-speed operation of the first transistors 91 possible.

In both of the first transistors 91 and the second transistors 92, the metal silicide films 96, 97 are not directly provided on the second semiconductor regions 62, but are provided on the semiconductor films 95 provided on the second semiconductor regions 62. Thus, it is possible to keep the positions of the bottoms of the metal silicide films 96, 97 further from the p-n junctions 80 on the bottoms of the second semiconductor regions 62 compared to the structure of providing the metal silicide films 96, 97 directly on the second semiconductor regions 62. Since the region including metal is kept away from the p-n junction 80, it is possible to make it difficult for the metal to reach the p-n junction 80 even if the metal is diffused, and thus, the junction leakage current can be suppressed.

In the second transistors 92 to which a higher voltage is applied than in the case of the first transistors 91, the volume of the metal silicide film 97 is smaller than the volume of the metal silicide film 96 in the first transistors 91. Therefore, the position of the bottom of the metal silicide film 97 in the second transistor 92 is located further from the p-n junction 80 than the position of the bottom of the metal silicide film 96 in the first transistor 91. This configuration is effective in suppressing the junction leakage in the second transistors 92 for which a higher withstand voltage is required than in the case of the first transistors 91.

In each of the embodiments described hereinabove, the material of the films formed as the sacrifice films before forming the metal silicide films is only required to be a material having etching selectivity with respect to the peripheral elements, and is not limited to the silicon-germanium film.

In the embodiments shown in FIG. 19 through FIG. 24, it is also possible for each of the contact holes 88, 89 to penetrate the semiconductor film 95 to reach the second semiconductor region 62. In this case, the metal silicide film 96 of the first transistor 91 has the shape including the first part provided in an area overlapping the contact electrode 93 viewed from above, and the second part having a bottom at a position shallower than the bottom of the first part similarly to the embodiments shown in FIG. 5 and FIG. 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
    a control section including a first transistor and a second transistor, the first transistor includes
        a semiconductor layer,
        a first gate insulating film provided on the semiconductor layer,
        a first gate electrode provided on the first gate insulating film,
        a first semiconductor film containing silicon, the first semiconductor film provided on the semiconductor layer at an area lateral to the first gate electrode in a gate length direction, and
        a first metal silicide film provided on the first semiconductor film, the second transistor includes
        the semiconductor layer,
        a second insulating film provided on the semiconductor layer, and thicker than the first gate insulating film,
        a second gate electrode provided on the second gate insulating film,
        a second semiconductor film containing silicon, the second semiconductor film provided on the semiconductor layer at an area lateral to the second gate electrode in a gate length direction, and
        a second metal silicide film provided on the second semiconductor film, and smaller in area than the first metal silicide film.

2. The device according to claim 1, further comprising:
    an inter-layer insulating layer provided on the semiconductor layer, and covering the first transistor and the second transistor;
    a first contact electrode extending in the inter-layer insulating layer toward the first metal silicide film, and having contact with the first metal silicide film; and
    a second contact electrode extending in the inter-layer insulating layer toward the second metal silicide film, and having contact with the second metal silicide film.

3. The device according to claim 1, wherein the first metal silicide film is thicker than the second metal silicide film.

4. The device according to claim 1, wherein the second semiconductor film is thicker than the first semiconductor film.

5. The device according to claim 1, further comprising:
    an element section provided on the semiconductor layer, and electrically connected to the control section.

6. The device according to claim 5, wherein the element section includes a plurality of memory cells disposed three-dimensionally.

* * * * *